(12) United States Patent
Shiraishi

(10) Patent No.: US 7,664,208 B2
(45) Date of Patent: Feb. 16, 2010

(54) EVALUATING DEVICE, REPRODUCING DEVICE, AND EVALUATING METHOD

(75) Inventor: Junya Shiraishi, Nagano (JP)

(73) Assignee: Sony Corporation, Tokyo (JP)

( * ) Notice: Subject to any disclaimer, the term of this patent is extended or adjusted under 35 U.S.C. 154(b) by 564 days.

(21) Appl. No.: 11/481,064

(22) Filed: Jul. 6, 2006

(65) Prior Publication Data

US 2007/0014385 A1 Jan. 18, 2007

(30) Foreign Application Priority Data

Jul. 8, 2005 (JP) ............................. 2005-200235

(51) Int. Cl.
*H04L 27/06* (2006.01)
(52) U.S. Cl. ..................................... 375/341
(58) Field of Classification Search ................. 375/262, 375/341
See application file for complete search history.

(56) References Cited

U.S. PATENT DOCUMENTS 7,038,869 B2 5/2006 Miyashita et al.
2003/0067998 A1 * 4/2003 Nakajima et al. ............ 375/341

FOREIGN PATENT DOCUMENTS

| JP | 2002-074667 | 3/2002 |
|---|---|---|
| JP | 2003-051163 | 2/2003 |
| JP | 2003-141823 | 5/2003 |
| JP | 2003-178537 | 6/2003 |
| JP | 2003-272304 | 9/2003 |

* cited by examiner

*Primary Examiner*—David C Payne
*Assistant Examiner*—Tanmay K Shah
(74) *Attorney, Agent, or Firm*—Finnegan, Henderson, Farabow, Garrett & Dunner, L.L.P.

(57) ABSTRACT

An evaluating device including: a Viterbi detector to perform bit detection by Viterbi detection from a reproduced signal in which bit information is reproduced; a metric difference calculator to calculate a metric difference between values of path metrics for a second path and a maximum likelihood path when at least an error pattern between the maximum likelihood path as a path surviving as a result of path selection by the Viterbi detector and the second path compared finally with the maximum likelihood path corresponds to one of a predetermined plural error patterns; and an evaluation value calculator to compare each of values of metric differences calculated by the metric difference calculator for each error pattern, with an individual threshold value obtained by dividing a Euclidean distance between the maximum likelihood path and the second path in each error pattern by a common value, and calculate a total number of values of the metric differences less than the threshold value as an evaluation value.

10 Claims, 15 Drawing Sheets

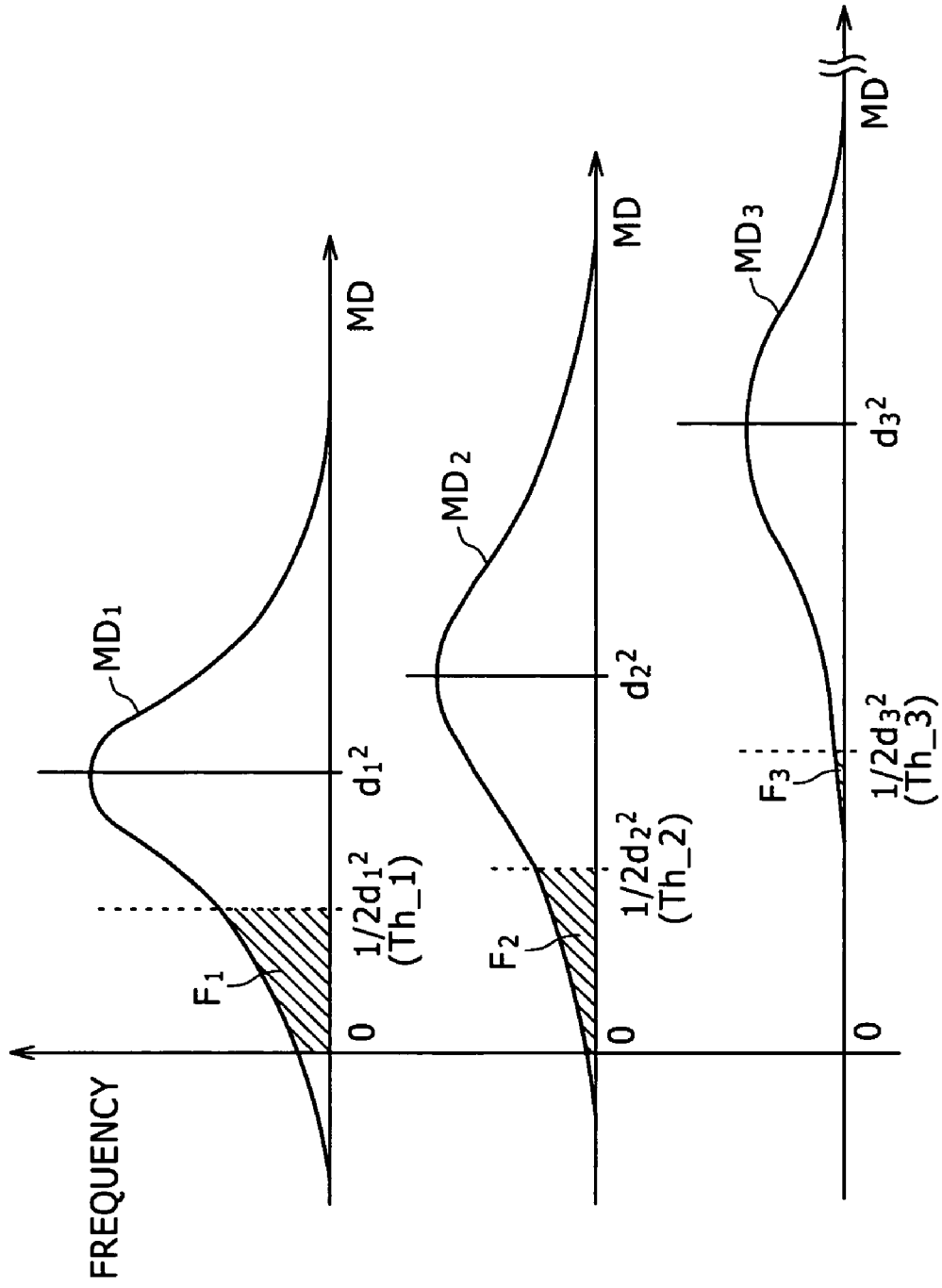

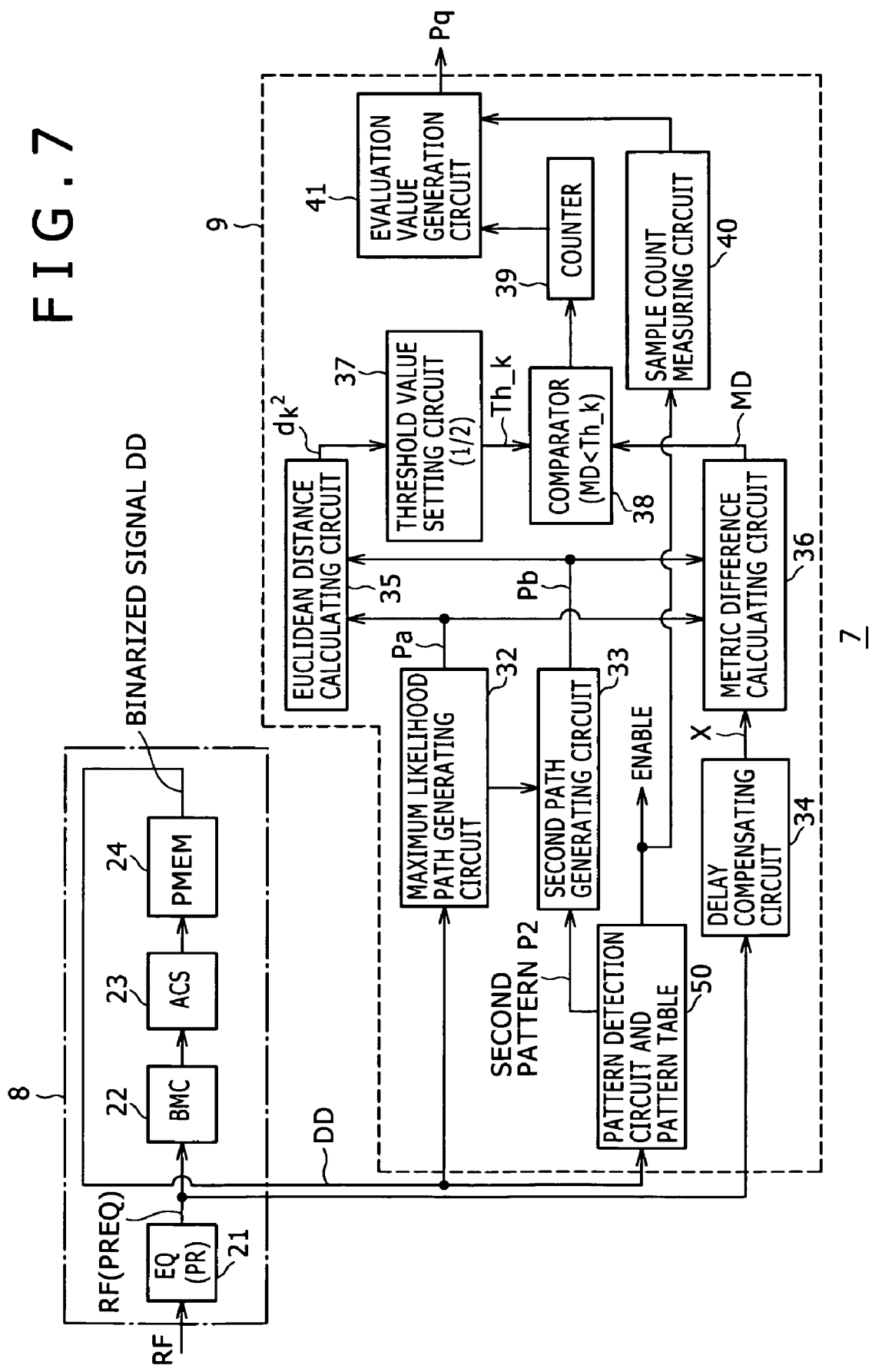

IDEAL PR1221 SIGNAL AND REFERENCE LEVELS

ADAPTATION TO INPUT SIGNAL HAVING
LOW 2T LEVELS (R-Lvc AND R-Lve)

LARGE MD ⇔ PROBABLE

SMALL MD ⇔ STRONG POSSIBILITY OF ERRONEOUS DETECTION

EVALUATING DEVICE, REPRODUCING DEVICE, AND EVALUATING METHOD

CROSS REFERENCES TO RELATED APPLICATIONS

The present invention contains subject matter related to Japanese Patent Application JP 2005-200235 filed in the Japanese Patent Office on Jul. 8, 2005, the entire contents of which being incorporated herein by reference.

BACKGROUND OF THE INVENTION

1. Field of the Invention

The present invention relates to an evaluating device suitable for a case where PRML (Partial Response Maximum Likelihood) decoding processing is performed on a reproduced signal from a recording medium, for example, a reproducing apparatus that includes such an evaluating device and reproduces information recorded on a recording medium, and an evaluating method.

2. Description of the Related Art

For example, as a method for evaluating signal quality of a reproduced signal from an optical disk, a method of evaluating time interval jitter (TI jitter) is known. TI jitter refers to variations (jitter) in time difference (time interval) between timing of a binary-level analog signal obtained by inputting a reproduced signal and a bit determination level to a comparator and timing of an edge of a clock synchronously reproduced from the reproduced signal.

Such a method of evaluating signal quality using TI jitter has been used as an evaluation method correlated to a bit error rate because in bit detection using an analog binary signal, variations in timing of edges of the binary signal directly affect the bit error rate. For CDs (Compact Discs), DVDs (Digital Versatile Discs) and the like using such analog binary detection, in particular, the method of evaluating signal quality using TI jitter has been widely used as a very effective signal evaluation method.

On the other hand, it has been confirmed that the above-described bit detection using an analog binary signal cannot secure a sufficiently low bit error rate as the density of information recorded on optical disks has been increased. For a Blu-Ray Disc or the like as a higher-density optical disk, in particular, a method referred to as PRML (Partial Response Maximum Likelihood) detection is now common as a bit detection method.

PRML is a technology that combines a process of partial response and a technology of maximum likelihood detection. Partial response refers to a process of returning an output longer than one bit in response to a one-bit input, that is, a process of making a determination by a plurality of input bits of the output. In particular, a process of obtaining a reproduced signal as a signal obtained by multiplying an input of four consecutive information bits by 1, 2, 2, and 1 in this order and adding the results, as often used for optical disks such as the Blu-Ray Disc and the like, is expressed as PR(1, 2, 2, 1).

Maximum likelihood detection is a method of defining a distance referred to as a path metric between two signal strings, determining a distance between an actual signal and a signal predicted from an assumed bit sequence, and detecting a bit sequence providing the closest distance. Incidentally, the path metric is defined as a distance obtained by adding the squares of differences in amplitude between two signals at same times over a whole time. Viterbi detection is used to search for the bit sequence providing the closest distance. Partial response maximum likelihood combining these methods is a method of adjusting a signal obtained from bit information on a recording medium such that the signal is in a partial response process by a filter referred to as an equalizer, determining a path metric between the resulting reproduced signal and the partial response of an assumed bit sequence, and detecting a bit sequence providing the closest distance.

An algorithm based on the above-mentioned Viterbi detection is effective in actually searching for a bit sequence providing a minimum path metric.

For the Viterbi detection, a Viterbi detector including a plurality of states formed with consecutive bits of a predetermined length as a unit and branches represented by transitions between the states is used, and is configured to detect a desired bit sequence efficiently from among all possible bit sequences.

An actual circuit is provided with two registers, that is, a register referred to as a path metric register for each state, for storing a path metric between a partial response sequence and a signal up to the state, and a register referred to as a path memory register, for storing a flow of a bit sequence (path memory) up to the state. The circuit is also provided with an operation unit referred to as a branch metric unit for each branch, for calculating a path metric between a partial response sequence and a signal at the bit.

The Viterbi detector can bring various bit sequences into one-to-one correspondence with individual paths passing through the above-described states. A path metric between a partial response sequence passing through these paths and an actual signal (reproduced signal) is obtained by sequentially adding together the above-mentioned branch metrics of interstate transitions forming the paths, that is, branches.

Further, a path that minimizes the above-described path metric can be selected by comparing the magnitudes of path metrics of two branches or less reached in each state, and sequentially selecting a path with a smaller path metric. Information on this selection is transferred to the path memory register, whereby information representing a path reaching each state by a bit sequence is stored. The value of the path memory register ultimately converges to a bit sequence that minimizes the path metric while being updated sequentially, and the result is output.

Thus, it is possible to search efficiently for a bit sequence that produces a partial response sequence closest to the reproduced signal as described above from a viewpoint of the path metric.

The bit detection using PRML is not directly affected by TI jitter as fluctuation in the direction of a time axis. That is, TI jitter does not necessarily have a correlation with a bit error rate in the bit detection using PRML, and thus is not necessarily appropriate as an index of signal quality.

In the case of PRML, fluctuation in the direction of an amplitude axis has a direct relation to the bit error rate in the bit detection. Hence, for the bit detection using PRML, an index incorporating fluctuation in the direction of an amplitude axis is desirable as a conventional index corresponding to the bit error rate.

As described above, the method of bit detection by PRML is an algorithm that compares the magnitudes of a path metric between a partial response sequence obtained from a correct bit sequence and a reproduced signal and a path metric between a partial response sequence obtained from an erroneous bit sequence and the reproduced signal, retains a closer path, that is, a path with a smaller path metric as a more likely path, and sets a path ultimately surviving after repetition of this operation (maximum likelihood path) as a result of detection.

According to such an algorithm, a large difference between the path metrics of the two closest paths (suppose that the two closest paths are a maximum likelihood path Pa and a second path Pb) with smallest path metric values as candidates selected for the ultimately surviving path indicates that the surviving path is more likely, whereas a small difference between the path metrics of the two closest paths indicates that the surviving path is more unlikely, that is, there is a stronger possibility of an detection error (see FIGS. 16A and 16B).

In other words, correct bit detection is performed when the path metric for the maximum likelihood path is smaller than the path metric for the second path. On the other hand, an error occurs when the path metric for the maximum likelihood path is larger than the path metric for the second path.

Thus, the capability of the PRML bit detection and consequently the signal quality of the reproduced signal can be determined on the basis of difference between the former path metric and the latter path metric.

That is, the difference between the path metric for the maximum likelihood path and the path metric for the second path is effectively used as an index corresponding to the bit error rate in PRML. Specifically, statistical information based on for example a variance value of such a metric difference is used.

When the PRML method is employed, difference patterns (error patterns) between the maximum likelihood path and the second path when detection errors actually occur are limited to a certain extent. Examples thereof include a one-bit error caused by an edge shifted by an amount corresponding to one bit, for example, and a two-bit error caused by disappearance of a 2T mark as a shortest mark, for example.

Error patterns actually appearing as an error in an early stage of use of PRML decoding for disk reproduction were limited substantially 100% to one error pattern. It was therefore possible to evaluate signal quality properly by obtaining a variance value of metric differences as described above only for the only error pattern.

However, with a recent further increase in recording density of the disk, error patterns that appear as an actual error have not been limited to the single pattern, and a plurality of patterns have come to contribute to errors.

Thus, when a variance value is obtained only for the single error pattern as in the conventional case, the contributions of other error patterns are not considered, and therefore a proper signal quality index may not be obtained.

Incidentally, even when a plurality of error patterns thus contribute to errors, in a case where the contribution of one error pattern (for example one-bit error) is prominently large, for example, a variance value of metric differences obtained for this error pattern can be treated as a signal evaluation index reflecting a total (overall) error occurrence rate.

For example, Japanese Patent Laid-open No. 2003-141823 describes a technique that sets a variance value of metric differences obtained for an error pattern having a minimum Euclidean distance as a total signal evaluation index.

However, when the contribution of one error pattern to errors is not dominant and rates of contribution of respective error patterns to a total error rate are comparable to each other, a proper signal quality evaluating index cannot be obtained unless the total error rate is estimated in consideration of the rates of contribution of the respective error patterns to the total error rate.

Accordingly, when the rates of contribution of the respective error patterns to the total error rate are thus comparable to each other, estimating the total error rate by obtaining a variance value of metric differences for each error pattern and assigning a weight to these variance values according to the respective contribution rates is considered.

Under an assumption that a distribution of metric differences for a certain error pattern k can be approximated by a normal distribution (Gaussian distribution), letting $d_k^2$ be a Euclidean distance between a maximum likelihood path and a second path in the case of the error pattern k, relation between a variance value of the metric differences for the error pattern k and a bit error rate $bER_k$ can be expressed by an integral of an exponential function referred to as an error function such as the following Equation 1.

$$bER_k = \frac{A_k}{\sqrt{2\pi\sigma_k^2}} \int_{x<0} \exp\left(-\frac{(x-d_k^2)^2}{2\sigma_k^2}\right) dx = \frac{A_k}{2}\left\{\mathrm{erfc}\left(\frac{d_k^2}{\sqrt{2\sigma_k^2}}\right)\right\} \quad \text{[Equation 1]}$$

where $A_k$ denotes a rate of contribution of the variance value of the metric differences for the error pattern k to a total error rate.

Hence, according to Equation 1, the bit error rate $bER_k$ can be obtained for each error pattern such that the rate of contribution of each error pattern is factored in. The total error rate can be estimated by adding together the values of such bit error rates.

SUMMARY OF THE INVENTION

Thus, when a plurality of error patterns contribute to actual occurrence of errors, the total error rate can be estimated on the basis of the relation between the variance value of the metric differences for each error pattern k and the bit error rate $bER_k$ as in the above Equation 1.

However, it is difficult to achieve this with a simple configuration because Equation 1 requires such a complex calculation as uses a mathematical table, rather than an elementary function.

In addition, the rate of contribution of each error pattern needs to be obtained to estimate the total error rate. For this, frequency of occurrence of each error pattern needs to be actually determined. This also hampers simplification of the calculation.

Thus, to estimate the error rate with a variance value of metric differences as an evaluation index requires a complex calculation using an error function such as Equation 1 for each error pattern. When this is to be actually achieved, circuit configuration and calculation are not simplified.

It is accordingly desirable to be able to calculate an evaluation index for estimating a total error rate more simply when a plurality of error patterns contribute to occurrence of errors in PRML decoding.

Thus, an evaluating device according to an embodiment of the present invention is constituted as follows.

The evaluating device includes Viterbi detecting means for performing bit detection by performing Viterbi detection from a reproduced signal in which bit information is reproduced.

The evaluating device also includes metric difference calculating means for calculating a metric difference as a difference between a value of a path metric for a second path and a value of a path metric for a maximum likelihood path when at least an error pattern between the maximum likelihood path as a path surviving as a result of path selection by the Viterbi detecting means and the second path compared finally with the maximum likelihood path corresponds to one of a predetermined plurality of error patterns.

The evaluating device further includes evaluation value calculating means for comparing each of values of metric differences for each error pattern, the metric differences being calculated by the metric difference calculating means, with an individual threshold value obtained by dividing a Euclidean distance between the maximum likelihood path and the second path in each error pattern by a common value, and calculating a total number of values of metric differences less than the threshold value as an evaluation value.

The metric difference referred to in the present invention is a difference between the value of the path metric for the second path and the value of the path metric for the maximum likelihood path. When an actual reproduced signal and the maximum likelihood path coincide with each other (that is, when a possibility of a detection error is a minimum), the value of the path metric for the maximum likelihood path is zero. Because the reproduced signal and the maximum likelihood path coincide with each other in this case, as described above, the value of the path metric for the second path is the value of a Euclidean distance between the maximum likelihood path and the second path. Thus, the metric difference defined as described above is an index that indicates best signal quality when the metric difference is the value of the Euclidean distance between the maximum likelihood path and the second path as a maximum value, and indicates worst signal quality when the metric difference is a minimum value of zero.

Under an assumption that a distribution of values of metric differences for a certain error pattern is a Gaussian distribution, this distribution has the Euclidean distance between the maximum likelihood path and the second path as an average value, and has a minimum value of zero (see FIG. 4). As is understood from this distribution, frequency of occurrence of values of metric difference less than a certain threshold value in this case (the area of a hatched part in FIG. 4) is a value correlated with frequency of occurrence of detection errors in which the values of metric differences <0, which cannot be actually measured.

In addition, in the present invention, an individual value obtained by dividing a Euclidean distance between the maximum likelihood path and the second path in each of a predetermined plurality of error patterns by a common value is set as a threshold value for values of metric difference in each of the error patterns, as described above. Then, the values of metric differences for each error pattern are compared with the individual value, and a total number of values of metric differences less than the threshold value is calculated as an evaluation value.

Thus, an individual threshold value obtained by dividing a Euclidean distance of each error pattern by a common value is set, and the information of frequency of occurrence of values of metric differences less than the threshold value is obtained for each error pattern. The information of the occurrence frequency thus obtained for each error pattern can reflect the information of a rate of contribution of the error pattern to a total error rate. Then, as described above, a sum of occurrence frequencies thus reflecting the rate of contribution of each error pattern is calculated as an evaluation value. This evaluation value can be an evaluation index that reflects the rate of contribution of each error pattern and correlates well with the total error rate.

Thus, according to the present invention, when a plurality of error patterns contribute to actual occurrence of errors in PRML decoding, it is possible to obtain a signal quality evaluation index that properly reflects the rate of contribution of each of the plurality of error patterns and correlates well with the total error rate.

Also, according to the above-described present invention, performing a complex calculation such as a square calculation, a square root calculation and the like as in a case of estimating the total error rate on the basis of an evaluation index such as a conventional variance value or the like is not required at all in obtaining such a proper signal quality evaluation index, and this signal quality evaluation index can be obtained with a simpler configuration.

Further, according to the above-described present invention, in obtaining the evaluation index that reflects the rate of contribution of each error pattern to the total error rate, it is not necessary to actually determine the rates of contribution of these error patterns. This also can simplify the calculation of the evaluation value.

BRIEF DESCRIPTION OF THE DRAWINGS

FIG. 6 is a diagram illustratively showing relations between the distributions of metric differences for the error patterns having the different Euclidean distances and evaluation quantities to be obtained in the embodiment;

FIG. 7 is a block diagram showing an internal configuration of an evaluating device according to a second embodiment;

DETAILED DESCRIPTION OF THE PREFERRED EMBODIMENTS

The best mode for carrying out the present invention (hereinafter referred to as embodiments) will hereinafter be described.

First Embodiment

Figure 1:
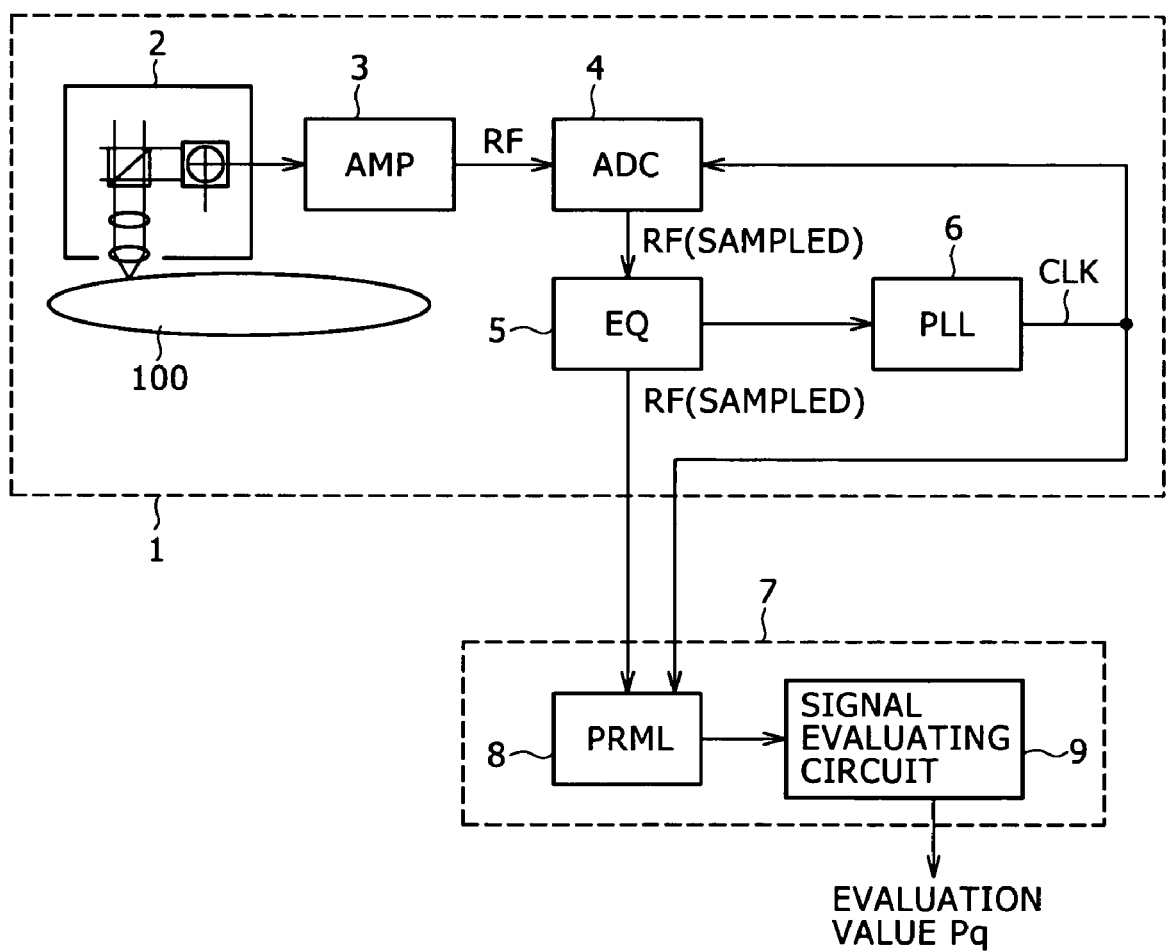
FIG. 1 is a block diagram showing an example of a configuration for evaluating a reproduced signal using an evaluating device according to an embodiment of the present invention.

FIG. 1 is a block diagram showing an example of a configuration for evaluating a reproduced signal from an optical disk recording medium, for example, using an evaluating device according to an embodiment of the present invention.

As shown in FIG. 1, the evaluation of the reproduced signal in this case uses a reproducing device 1 for evaluation for reproducing the signal from an optical disk 100 and an evaluating device 7 for evaluating the reproduced signal output by the reproduction device 1 for evaluation.

The reproduction device 1 for evaluation includes for example an optical pickup 2 for reproducing bit information from the optical disk 100 as a removable medium, and a preamplifier 3 for converting the signal read by the optical pickup 2 into a reproduced signal (RF signal).

The reproduction device 1 for evaluation further includes an A/D converter 4 for subjecting the reproduced signal RF to A/D conversion, an equalizer 5 for adjusting the waveform of the reproduced signal RF for PLL (Phase Locked Loop) processing, and a PLL circuit 6 for reproducing a clock CLK from the reproduced signal RF.

In this case, the reproduced signal RF obtained through the optical pickup 2 and the preamplifier 3 is subjected to digitalization sampling by the A/D converter 4 (RF (Sampled)). This sampling is performed in the same timing as the clock CLK synchronous with a channel bit which clock is reproduced by the PLL circuit 6. The above-mentioned equalizer 5 performs waveform shaping operation on sampling information of such a reproduced signal RF.

The reproduction device 1 for evaluation supplies the reproduced signal RF obtained by the equalizer 5 and the clock CLK obtained by the PLL circuit 6 to the evaluating device 7 disposed outside the reproduction device 1 for evaluation.

The evaluating device 7 is an evaluating device as an embodiment. The evaluating device 7 includes a PRML (Partial Response Maximum Likelihood) decoder 8 (Viterbi detector) and a signal evaluating circuit 9.

The PRML decoder 8 obtains a binarized signal DD by detecting bit information from the reproduced signal RF supplied from the reproduction device 1 for evaluation on the basis of the clock CLK supplied from the same reproduction device 1.

The signal evaluating circuit 9 is configured to calculate an evaluation value Pq according to the embodiment on the basis of an output (at least the binarized signal DD and the reproduced signal RF (RFEQ)) from the PRML decoder 8 and the clock CLK, as will be described later.

Suppose in the following description that a signal is recorded on the optical disk 100 so as to satisfy a D1 constraint (a minimum run length d=1 and a shortest mark length of 2T). In addition, suppose that a PRML target response (PRML type) is PR(1, 2, 2, 1) or PR(1, 2, 2, 2, 1).

Figure 2:
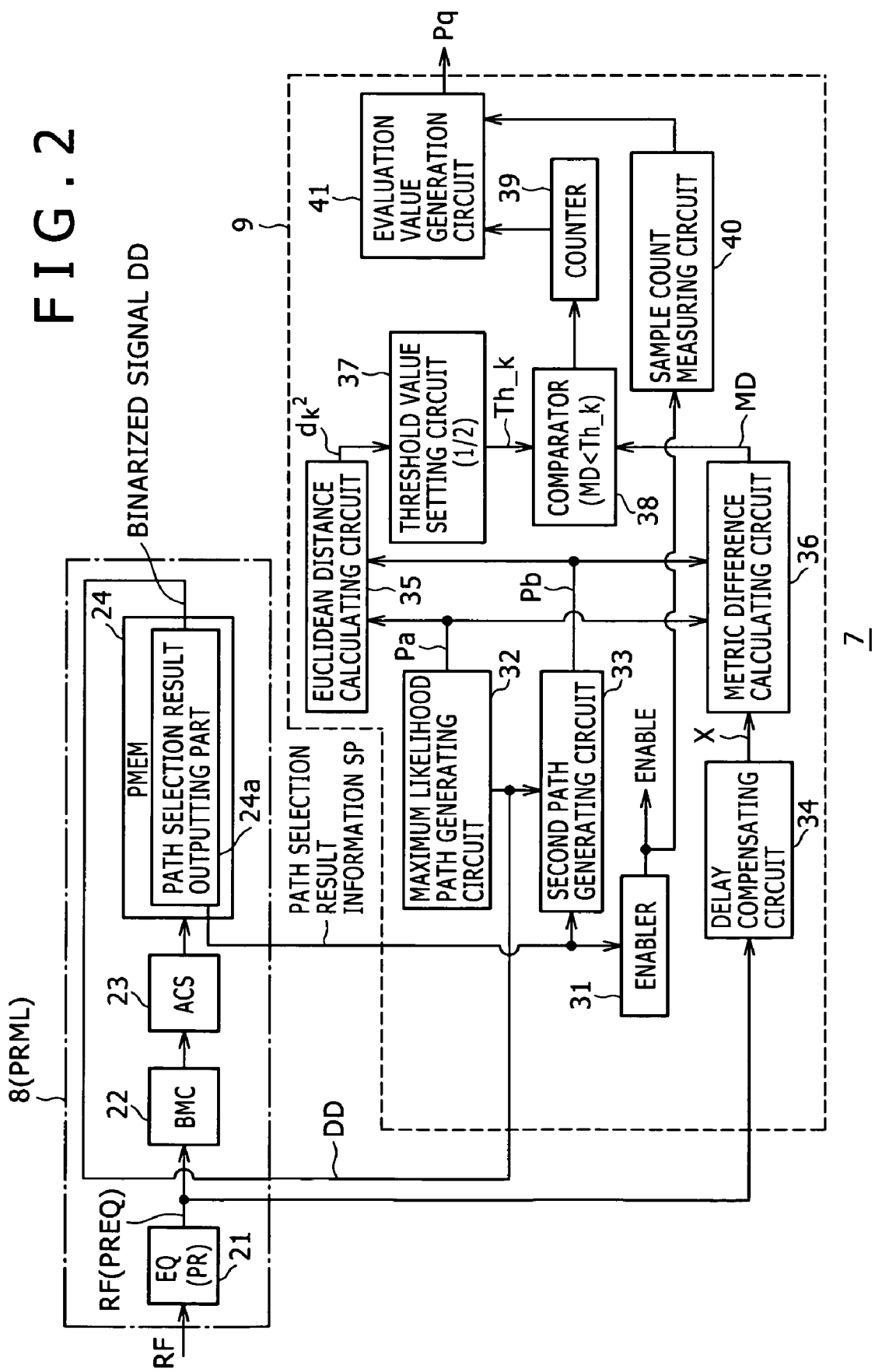
FIG. 2 is a block diagram showing an internal configuration of the evaluating device according to the first embodiment.

FIG. 2 is a block diagram showing an internal configuration of the evaluating device 7 shown in FIG. 1.

Incidentally, though not shown in the figure, the clock CLK from the reproduction device 1 for evaluation is supplied as an operating clock to each part within the PRML decoder 8 and the signal evaluating circuit 9 shown in FIG. 2.

The PRML decoder 8 includes: a waveform equalizer (EQ (PR)) 21 for equalizing channel response to target response; a branch metric calculating unit (BMC) 22 for calculating a branch metric for each branch from the output of the equalizer 21; a path metric updating unit (ACS) 23 for taking in branch metrics, comparing these branch metrics, and selecting a path, and updating a path metric; and a path memory updating unit (PMEM) 24 for updating a path memory according to information on the selected path.

The role of the equalizer 21 shown in FIG. 2 is to equalize channel response to target response PR(1, 2, 2, 1) or PR(1, 2, 2, 2, 1). The target response is not necessarily limited to this; for example, in a case of a D2 constraint (a minimum run length d=2 and a shortest mark length of 3T), a target with a longer constraint length is used.

The reproduced signal RF (RFEQ) resulting from the equalization process by the equalizer 21 is supplied to the branch metric calculating unit 22, and also supplied to a delay compensating circuit 34 to be described later within the signal evaluating circuit 9.

The branch metric calculating unit 22 calculates a branch metric corresponding to each branch on the basis of the value of the reproduced signal RF from the equalizer 21 and the value of each reference level set according to a PRML type being employed.

Description of Viterbi detecting operation in the following will be focused on an example with a five-tap constraint length as in PR(1, 2, 2, 2, 1). When there is a D1 constraint (a minimum run length d=1 and a shortest mark length of 2T) as a minimum run-length rule, the PRML decoder 8 having the branch metric calculating unit 22, the path metric updating unit 23, and the path memory updating unit 24 is provided with 10 states each composed of four bits and 16 branches each composed of five bits. These branches make a connection between states in compliance with the D1 constraint.

The 10 states each composed of four bits are states identified as 10 bit strings 0000, 0001, 0011, 0110, 0111, 1000, 1001, 1100, 1110, and 1111 that satisfy the D1 constraint, that is, a constraint requiring zero or one not to appear singly (not to appear singly in two bits in the middle of four bits in a four-bit string as described above) among 16 bit strings each composed of four bits which strings are 0000, 0001, 0010, 0011, 0100, 0101, 0110, 0111, 1000, 1001, 1010, 1011, 1100, 1101, 1110, and 1111.

The 16 braches each composed of five bits are states identified as 16 bit strings 00000, 00001, 00011, 00110, 00111, 01100, 01110, 01111, 10000, 10001, 10011, 11000, 11001, 11100, 11110, and 11111 that satisfy the D1 constraint, that is, the constraint requiring zero or one not to appear singly (not to appear singly in three bits in the middle of five bits in a five-bit string as described above) among 32 bit strings each composed of five bits which strings are 00000, 00001, 00010, 00011, 00100, 00101, 00110, 00111, 01000, 01001, 01010, 01011, 01100, 01101, 01110, 01111, 10000, 10001, 10010, 10011, 10100, 10101, 10110, 10111, 11000, 11001, 11010, 11011, 11100, 11101, 11110, and 11111.

Incidentally, when target response is PR(1, 2, 2, 1), six states each composed of three bits and 10 branches each composed of four bits are provided. The branches make a connection between states in compliance with the D1 constraint.

A method of preparing the bit strings of the states and the branches is similar to the method of preparing the bit strings of the states and the branches in PR(1, 2, 2, 1).

The branch metric calculating unit 22 calculates a branch metric for the 16 branches described above, and transfers the result to the path metric updating unit 23.

The path metric updating unit (ACS) 23 updates the path metrics of paths reaching the 10 states, and simultaneously transfers path selection information to the path memory updating unit 24.

The path memory updating unit 24 updates a path memory of the paths reaching the above-mentioned 10 states. Bit sequences stored in the path memory converge into a likely sequence while path selection is repeated. The result is output as the binarized signal DD as a result of bit detection by the PRML decoder 8.

In this case, the binarized signal DD is supplied to a maximum likelihood path generating circuit 32 and a second path generating circuit 33 to be described later within the signal evaluating circuit 9, as shown in FIG. 2.

The path memory updating unit 24 updates the path memory of the paths reaching the above-mentioned 10 states, and thereby obtains information on the bit sequence of a likely path (maximum likelihood path) that ultimately survives and information on the bit sequence of a next likely path (second path).

The path memory updating unit 24 in the first embodiment is provided with a path selection result outputting part 24a for outputting the information on the bit sequences of the maximum likelihood path and the second path as path selection result information SP.

The path selection result information SP output by the path selection result outputting part 24a is supplied to an enabler 31 and the second path generating circuit 33 to be described later within the signal evaluating circuit 9.

As is understood from the above-described configuration of the PRML decoder 8, a method of bit detection by PRML is an algorithm that compares the magnitudes of a Euclidean distance between a partial response sequence obtained from a correct bit sequence and the reproduced signal RF (that is, a path metric for the correct bit sequence) and a Euclidean distance between a partial response sequence obtained from an erroneous bit sequence and the reproduced signal RF (that is, a path metric for the erroneous bit sequence), retains a closer path, that is, a path with a smaller path metric as a more likely path, and provides a path ultimately surviving after repetition of this operation (maximum likelihood path) as a result of detection.

According to such an algorithm, a large difference between the path metrics of the two closest paths (suppose that the two closest paths are a maximum likelihood path Pa and a second path Pb) with smallest path metric values as candidates selected for the ultimately surviving path indicates that the surviving path is more likely, whereas a small difference between the path metrics of the two closest paths indicates that the surviving path is more unlikely, that is, there is a stronger possibility of an detection error. This will be described with reference to FIGS. 16A and 16B.

Figure 16A:
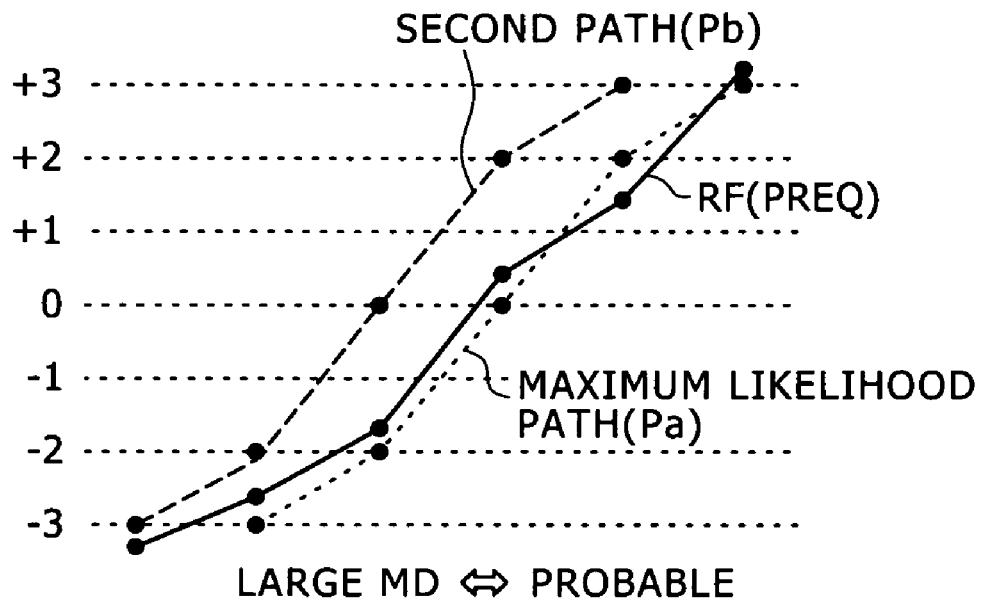
FIGS. 16A and 16B are diagrams of assistance in explaining relation between a maximum likelihood path, a second path, and a reproduced signal.
Figure 16B:
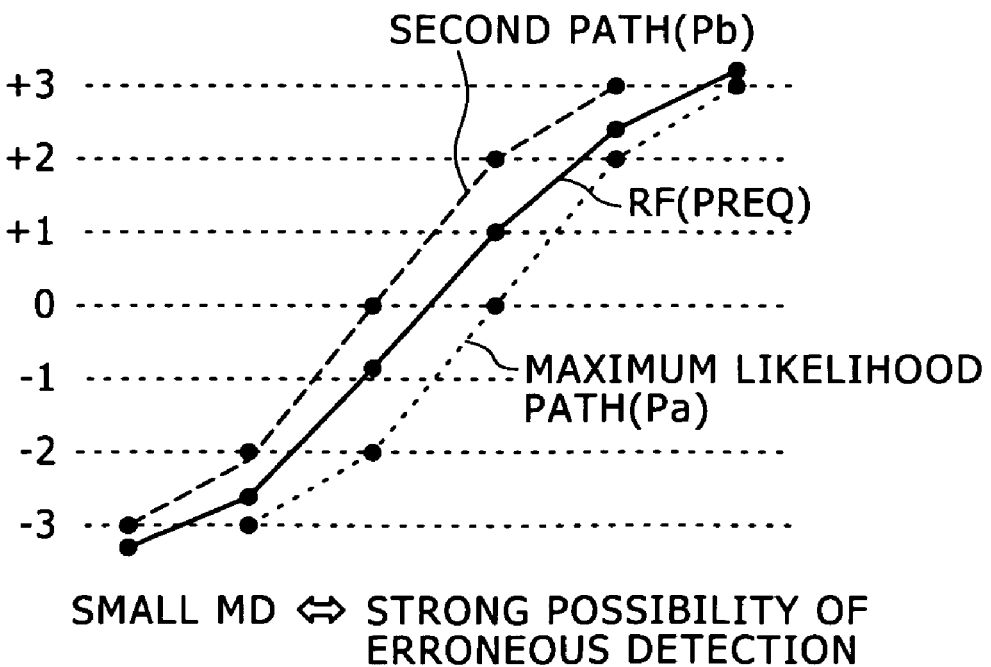

FIGS. 16A and 16B are diagrams showing relation between the maximum likelihood path Pa, the second path Pb, and the actual reproduced signal RF (PREQ). Values "+3, +2, +1, 0, −1, −2, −3" on an axis of ordinates in the figures represent values of reference levels assumed in PR(1, 2, 2, 1).

The maximum likelihood path Pa and the second path Pb shown in the figures can be considered to be the two paths for final comparison with the reproduced signal RF. That is, a path metric value for the maximum likelihood path Pa and a path metric value for the second path Pb are compared with each other, and a path with a smaller path metric value is selected as a survivor path.

Incidentally, for confirmation, a path metric is a sum of Euclidean distances, that is, a sum of branch metrics between sampling values of the reproduced signal RF which values are obtained in respective sampling timings indicated by black dots in FIGS. 16A and 16B and respective values obtained in corresponding timings in the maximum likelihood path Pa (or the second path Pb).

A comparison between FIG. 16A and FIG. 16B indicates that in the case of FIG. 16A, the Euclidean distance between the maximum likelihood path Pa and the reproduced signal RF is sufficiently close, whereas the Euclidean distance between the second path Pb and the reproduced signal RF is sufficiently far. That is, the path metric value for the maximum likelihood path Pa is sufficiently small and the path metric value for the second path Pb is sufficiently large. It is thereby possible to determine that the maximum likelihood path Pa as a detection path in this case is a more likely path.

On the other hand, in FIG. 16B, the Euclidean distance between the maximum likelihood path Pa and the reproduced signal RF is increased as compared with FIG. 16A, and the Euclidean distance between the second path Pb and the reproduced signal RF is closer. That is, in this case, the path metric value for the maximum likelihood path Pa is larger than in FIG. 16A, whereas the path metric value for the second path Pb is smaller than in FIG. 16A. Therefore the likelihood of the maximum likelihood path Pa as detection path in this case is decreased. In other words, in this case, the likelihood of the second path Pb as the other path is increased, and thus the possibility of the second path Pb being the maximum likelihood path is increased. Hence, there is a stronger possibility that the detection path as the maximum likelihood path Pa is erroneously detected in place of the path shown as the second path Pb.

Thus, when the path metric value for the maximum likelihood path Pa is sufficiently smaller than the path metric value for the second path Pb, it can be determined that more likely bit detection is performed. On the other hand, as the path metric value for the maximum likelihood path Pa becomes larger and the path metric value for the second path Pb becomes smaller, it can be determined that there is a stronger possibility of the detection path as the maximum likelihood path Pa being the wrong path.

Detection accuracy (reproduced signal quality) when the PRML method is employed can be estimated by a difference between the path metric value for the maximum likelihood path Pa and the path metric value for the second path Pb, that is, a metric difference.

In the present embodiment, such a metric difference (denoted as MD) is defined as follows.

$$MD = \sum_i (PB_i - R_i)^2 - \sum_i (PA_i - R_i)^2 \quad \text{[Equation 2]}$$

where $PB_i$, $PA_i$, and $R_i$ represent the respective values of the second path Pb, the maximum likelihood path Pa, and the reproduced signal RF in same sampling timing.

That is, the metric difference MD in this case is defined as a value obtained by subtracting the path metric value for the maximum likelihood path Pa from the path metric value for the second path Pb.

The metric difference MD has a maximum value when the path metric value for the maximum likelihood path Pa in the right member of the above equation is zero, that is, when the maximum likelihood path Pa and the reproduced signal RF exactly coincide with each other. That is, this metric difference MD is information indicating that the larger the value of the metric difference MD, the higher the detection accuracy (that is, the better the signal quality).

FIGS. 16A and 16B described above indicate that when the maximum likelihood path Pa and the reproduced signal RF exactly coincide with each other as described above, the path metric for the second path Pb is a Euclidean distance between the maximum likelihood path Pa and the second path Pb. Hence, the maximum value of the metric difference MD as described above is the value of the Euclidean distance between the maximum likelihood path Pa and the second path Pb.

A minimum value of the metric difference MD is zero when the path metric value for the maximum likelihood path Pa and the path metric value for the second path Pb are a same value. That is, the minimum value of the metric difference MD is obtained when the reproduced signal RF is situated at an exact middle position between the maximum likelihood path Pa and the second path Pb in the case of FIGS. 16A and 16B. That is, the value of zero of the metric difference MD indicates that the maximum likelihood path and the second path are equally likely, and thus indicates a strongest possibility of an error.

Thus, the metric difference MD in the case of the present embodiment is information indicating higher detection accuracy as the metric difference MD becomes closer to the value of the Euclidean distance between the maximum likelihood path Pa and the second path Pb (maximum value), and conversely indicating lower detection accuracy and stronger possibility of an error as the metric difference MD becomes closer to zero (minimum value).

It is thus possible to estimate a rate of occurrence of errors in the PRML decoder 8 on the basis of the value of difference between the path metric value for the maximum likelihood path Pa and the path metric value for the second path Pb such as the metric difference MD obtained by the above Equation 2.

Traditionally, statistical information such for example as a variance value of values of the metric difference MD as the difference between the path metric value for the maximum likelihood path Pa and the path metric value for the second path Pb is obtained to estimate the error rate.

When the PRML method is employed, difference patterns (error patterns) between the maximum likelihood path and the second path that can actually constitute a detection error are limited to a certain extent.

Examples thereof include a one-bit error in which an edge of the bit sequence pattern of the second path is shifted by an amount corresponding to one bit with respect to the bit sequence pattern of the maximum likelihood path, and a two-bit error caused by disappearance of a 2T mark as a shortest mark.

Error patterns actually appearing as an error in an early stage of use of PRML decoding for optical disk reproduction were limited substantially 100% to one-bit errors. It was therefore possible to evaluate signal quality properly by obtaining a variance value of metric differences only for the one-bit error as the only error pattern.

However, with a recent further increase in recording density of the optical disk, error patterns that can appear as an actual error have not been limited to the single pattern, and a plurality of patterns have come to contribute to errors.

Thus, when a variance value is obtained only for the single error pattern as in the traditional case, the contributions of other error patterns are not considered, and therefore a proper signal quality evaluating index may not be obtained.

It is more difficult to obtain a proper signal quality evaluating index especially when the contribution of one error pattern to errors is not dominant and rates of contribution of respective error patterns to a total error rate are comparable to each other.

Accordingly, when the rates of contribution of the respective error patterns to the total error rate are thus comparable to each other, estimating the total error rate with a weight assigned to a variance value of metric differences MD for each error pattern according to the rate of contribution of the error pattern is considered.

However, as described above, such a method requires a complex calculation using a square calculation, a square root calculation and the like as in the foregoing Equation 1. It is therefore difficult to achieve this method with a simple configuration.

In addition, the above method requires the rate ($A_k$) of contribution of each error pattern to the total error rate to be determined in estimating the total error rate. This also hampers simplification of the calculation.

Accordingly, the present embodiment employs a method to be described below to realize an evaluation index that properly reflects the rate of contribution of each error pattern and correlates well with the total error rate with a simpler configuration even when the rates of contribution of respective error patterns to the total error rate are comparable to each other.

Figure 3:
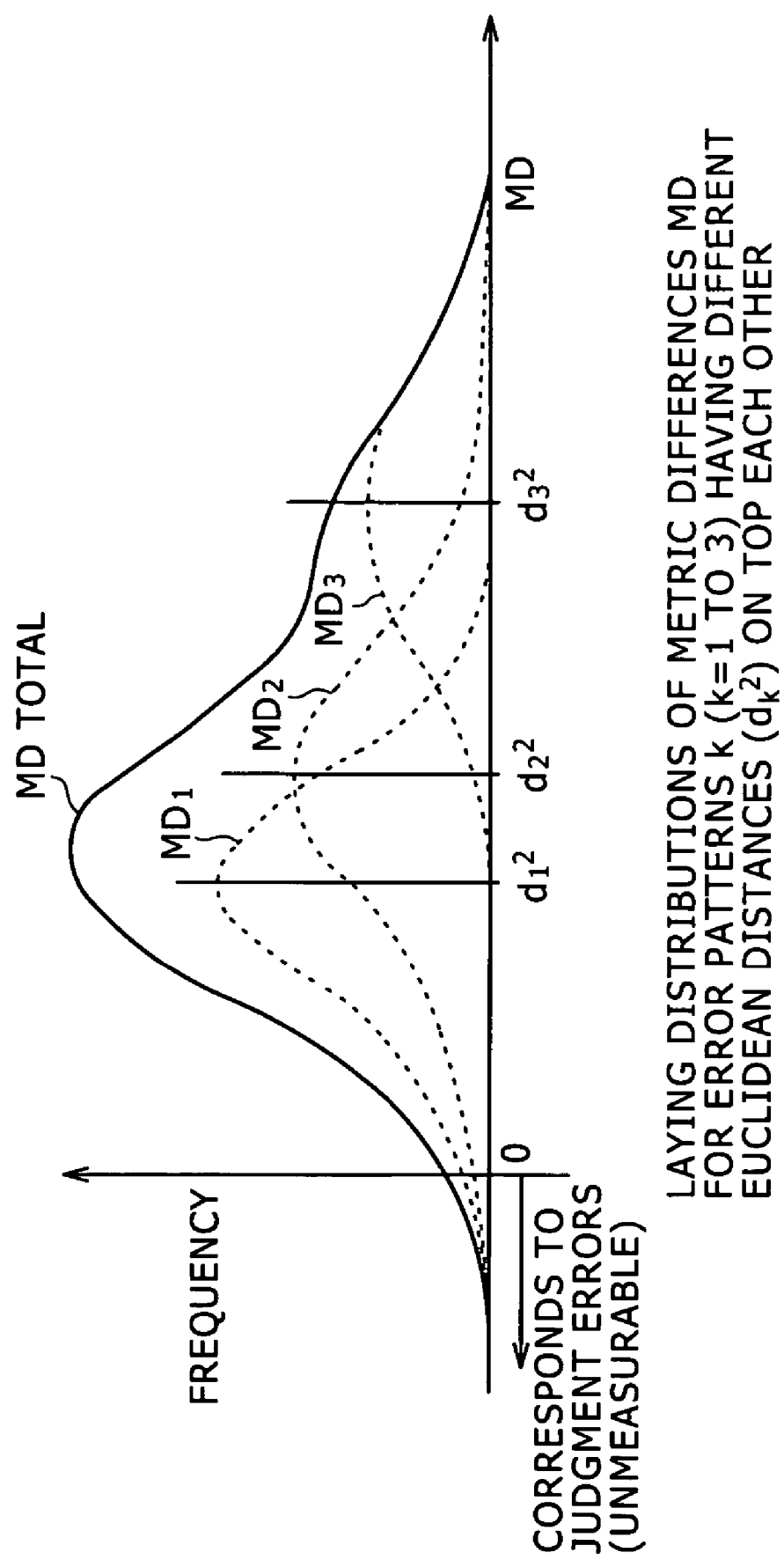
FIG. 3 is a diagram showing an example of distributions of metric differences for error patterns having different Euclidean distances.

First, FIG. 3 shows an example of distributions of metric differences MD for error patterns having different Euclidean distances from each other. Incidentally, in this figure, an axis of ordinates indicates sample frequency, and an axis of abscissas indicates values of metric differences MD.

Suppose that in FIG. 3, three error patterns 1 to 3, for example, principally contribute to actual occurrence of errors, and FIG. 3 shows an example of distributions of metric differences MD for the three error patterns.

For example, a distribution denoted as $MD_1$ in FIG. 3 is a distribution of metric differences MD for error pattern 1 corresponding to a so-called one-bit error in which the number of different bits of the bit sequence of the maximum likelihood path Pa from those of the bit sequence of the second path Pb is one. A distribution denoted as $MD_2$ is for example a distribution of metric differences MD for error pattern 2 corresponding to a so-called two-bit error caused by a shift of a shortest mark or the like. A distribution denoted as $MD_3$ is for example a distribution of metric differences MD for error pattern 3 corresponding to a three-bit error.

Incidentally, a distribution denoted as "MD total" in FIG. 3 is represented by laying the three distributions $MD_1$ to $MD_3$ on top of each other.

In this case, the number of different bits of the maximum likelihood path from those of the second path differs as described above, and therefore the Euclidean distance between the maximum likelihood path Pa and the second path Pb differs in error patterns 1 to 3.

The Euclidean distance between the maximum likelihood path Pa and the second path Pb can be calculated by obtaining the squares of differences between values traced by the respective paths and then obtaining a sum of the squares of the differences.

Hence, in this case, letting $PA_i$ and $PB_i$ be values in the maximum likelihood path Pa and the second path Pb, respectively, in same sampling timing, the Euclidean distance $d_k^2$ in each error pattern k can be expressed by $$d_k^2 = \sum_i (PA_i - PB_i)^2 \qquad \text{[Equation 3]}$$

Under an assumption that distributions of metric differences MD are Gaussian distributions, an average value of each distribution is the value of the Euclidean distance $d_k^2$ between the maximum likelihood path Pa and the second path Pb in the error pattern k. That is, assuming that a distribution of metric differences MD is thus a Gaussian distribution, the average value of the distribution should be the value of a metric difference MD at a time of best signal quality. According to the above Equation 2 for calculating the metric difference MD, the value of the Euclidean distance between the maximum likelihood path Pa and the second path Pb is the value of the metric difference MD at the time of best signal quality.

In this case, the Euclidean distance between the maximum likelihood path Pa and the second path Pb in error pattern 1 is represented as Euclidean distance $d_1^2$; the Euclidean distance between the maximum likelihood path Pa and the second path Pb in error pattern 2 is represented as Euclidean distance $d_2^2$; and the Euclidean distance between the maximum likelihood path Pa and the second path Pb in error pattern 3 is represented as Euclidean distance $d_3^2$.

Reference to FIG. 3 shows that the Euclidean distance $d_k^2$ between the maximum likelihood path Pa and the second path Pb increases in order of $d_1^2$, $d_2^2$, and $d_3^2$, or in order of error pattern 1 ($MD_1$), error pattern 2 ($MD_2$), and error pattern 3 ($MD_3$) in which order the number of different bits of the second path Pb (the bit sequence of the second path Pb) with respect to the maximum likelihood path Pa (the bit sequence of the maximum likelihood path Pa) increases.

It can also be understood that a rate at which the value of the metric difference MD exceeds zero (is less than zero), that is, a rate of occurrence of detection errors is decreased in order of error pattern 1 ($MD_1$), error pattern 2 ($MD_2$), and error pattern 3 ($MD_3$) in which order the Euclidean distance $d_k^2$ increases, that is, in which order the number of different bits increases, and that the rate of contribution to the total error rate is correspondingly decreased. In other words, it can be understood that the rate of contribution to the total error rate is increased in order of error pattern 3 ($MD_3$), error pattern 2 ($MD_2$), and error pattern 1 ($MD_1$).

For confirmation, at a part where the value of the metric difference MD indicated by the axis of abscissas in FIG. 3 is zero, the path metric value for the maximum likelihood path Pa is equal to the path metric value for the second path Pb, as is understood from the earlier description of the metric difference MD, and hence a detection error probability is highest.

A part where the value of the metric difference MD exceeds the part of zero (is less than zero) represents actual detection errors. This part cannot be observed in PRML. That is, while the value of the metric difference MD thus exceeding zero and becoming a negative value means that the path metric value for the second path Pb is smaller than the path metric value for the maximum likelihood path Pa, it is impossible that the value of the metric difference MD thus becomes a negative value because the PRML detection method detects a path having a minimum path metric value as the maximum likelihood path, as is understood from the description so far. Hence, this detection error part cannot be actually observed.

Thus, because the detection error part cannot be actually observed in PRML, conventionally, a variance value of metric differences (difference between the path metric value for the second path Pb and the path metric value for the maximum likelihood path Pa) is obtained, and an error rate is estimated on the basis of the variance value, as described above. To obtain such a variance value requires a square calculation, a square root calculation and the like, so that complication of the configuration is inevitable.

Accordingly, the present embodiment obtains an evaluation value on the basis of the following concepts in order to avoid the complication of the configuration in this respect.

Figure 4:
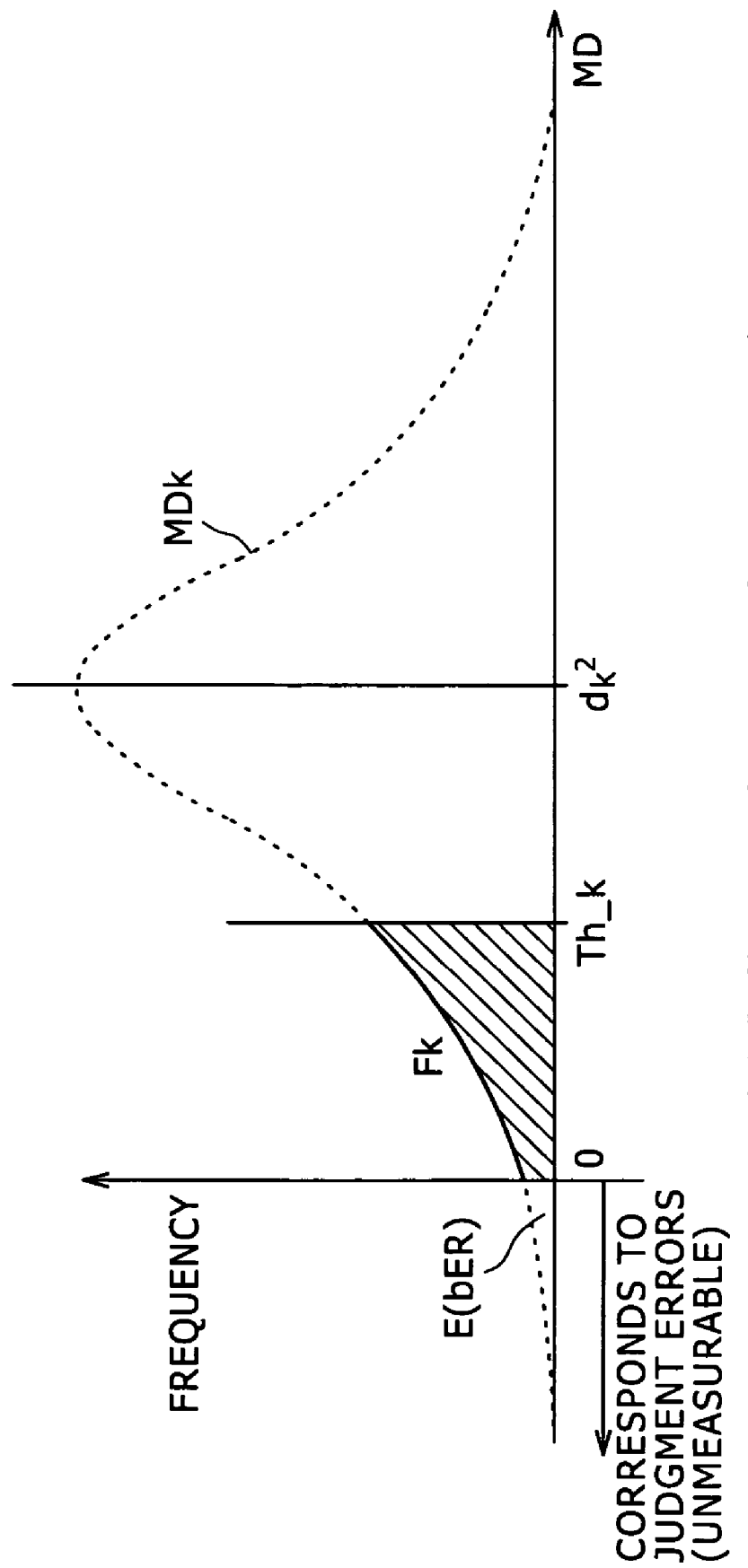
FIG. 4 is a diagram illustratively showing a relation between a distribution of metric differences and a signal quality evaluation quantity to be obtained in the embodiment.

FIG. 4 as a diagram of assistance in explaining a method employed in the present example shows a distribution (MDk) of metric differences MD in an error pattern k.

Incidentally, in this figure, as in FIG. 3, an axis of ordinates indicates sample frequency, and an axis of abscissas indicates values of metric difference MD.

As shown in FIG. 4, the present embodiment estimates an error rate by setting a predetermined threshold value (Th_k) for values of metric difference MD, and determining the frequency (Fk) of occurrence of values of metric difference MD which values are less than the threshold value.

It is understood that the frequency (Fk) of occurrence of values of metric difference MD which values are less than the threshold value Th_k is correlated with a part where metric difference MD<0 (bit error rate bER).

Figure 5A:
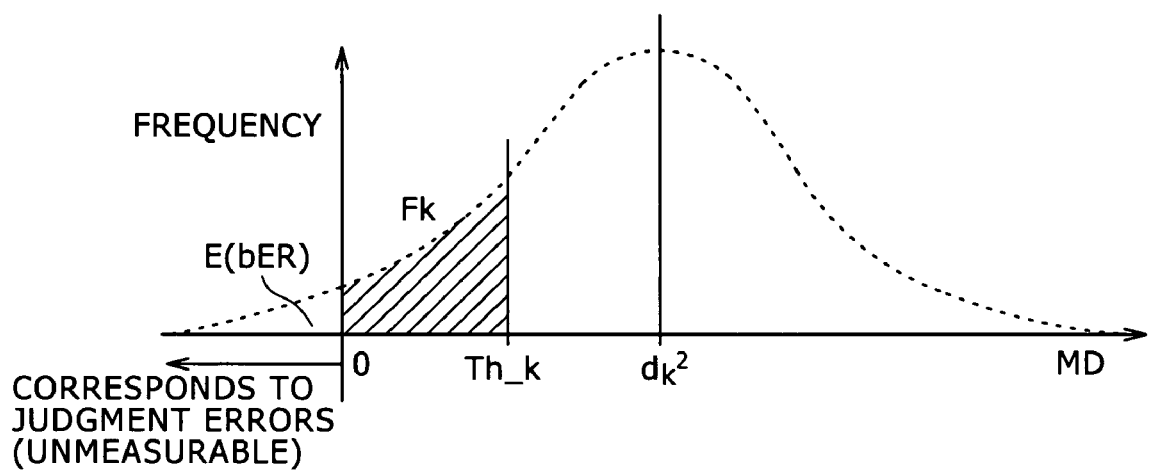
FIGS. 5A and 5B are diagrams of assistance in explaining correlation of the evaluation quantity obtained in the embodiment with an error rate.

Specifically, the distribution MDk when the bit error rate bER is increased with signal quality degraded as compared with FIG. 4, for example, has a more extended foot as shown in FIG. 5A, for example. The above occurrence frequency Fk (the area of the part FK in the figure) is correspondingly increased as compared with FIG. 4. That is, the occurrence frequency Fk increases as the bit error rate bER is increased.

Figure 5B:
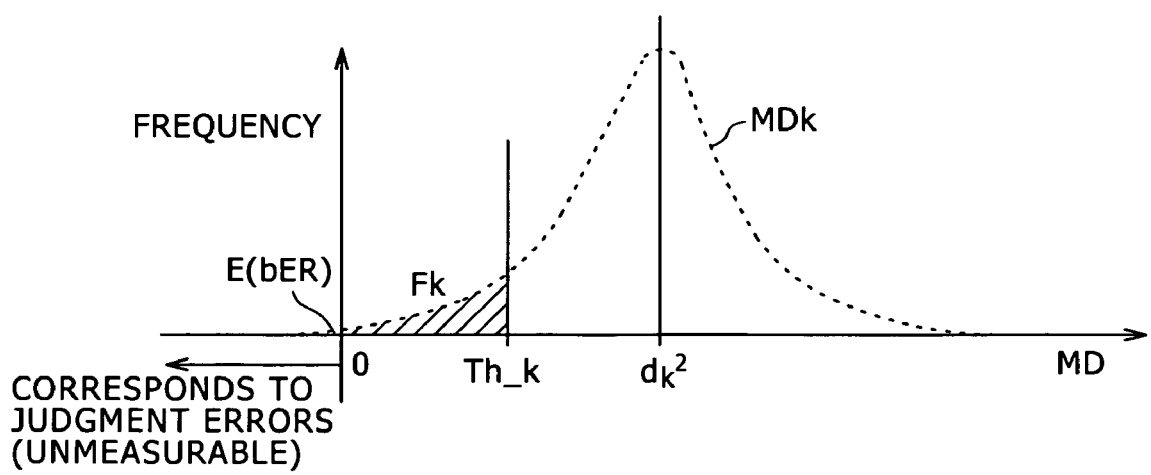

On the other hand, when the bit error rate bER is decreased with signal quality improved as compared with FIG. 4, the distribution MDk has a sharper shape as shown in FIG. 5B, for example. In this case, the occurrence frequency Fk is also decreased. Thus, the value of the occurrence frequency Fk decreases as the bit error rate bER is decreased.

It can thus be understood that an index correlated to the bit error rate bER can be obtained by the frequency (Fk) of occurrence of values of metric difference MD which values are less than the threshold value Th_k.

According to the above-described method, a proper signal evaluation index correlated with the bit error rate bER can be obtained only for one error pattern k. On the other hand, the present embodiment supposes that the total error rate includes contributions of a plurality of error patterns k different from each other.

Specifically, in this case, values of metric difference MD need to be compared with the above threshold value Th_k for each of the plurality of error patterns k. At this time, if values of metric difference MD are compared with the one above threshold value Th_k for all the error patterns k, for example, the bit error rate bER cannot be estimated in such a manner as to reflect the contribution of each of the plurality of error patterns k.

Thus, in the present embodiment, an individual threshold value Th_k (Th__1, Th__2, and Th__3) obtained by dividing a Euclidean distance $d_k^2$ in each error pattern k by a common value is set as the above threshold value Th_k in estimating the error rate. Then, for each error pattern k, the number (frequency of occurrence) of values of metric difference MD which values are less than the individual threshold value Th_k is counted.

For example, in the present embodiment, the common value is set at two, and a value of ½ of a Euclidean distance $d_k^2$ in each error pattern k is set as the threshold value Th_k.

FIG. 6 shows a relation between the threshold value Th_k (Th__1, Th__2, and Th__3) set as described above for each error pattern k and the frequency $F_k$ ($F_1$ to $F_3$) of occurrence of samples less than the threshold value Th_k, for the distributions $MD_1$ to $MD_3$ of metric differences MD in each error pattern k (k=1 to 3) shown in FIG. 3.

As shown in FIG. 6, the threshold values Th__1 to Th__3 in this case are ½ of the respective Euclidean distances in error patterns 1 to 3, and hence ½ $d_1^2$, ½ $d_2^2$, and ½ $d_3^2$ are set as the threshold values Th__1 to Th__3.

Thus, setting a value obtained by dividing the Euclidean distance $d_k^2$ in each error pattern by the common value of two as the individual threshold value Th_k for each error pattern k means that the frequency of occurrence of samples in each of the distributions $MD_1$ to $MD_3$ is obtained on the basis of the common judgment criterion of ½ of the Euclidean distance $d_k^2$.

Thus, the frequency of occurrence of ½ and more of a deviation representing a detection error is obtained for each of the distributions $MD_1$ to $MD_3$.

Thus, information on the frequency of occurrence of values of metric difference MD which values are less than the threshold value Th_k which information is obtained for each error pattern k can reflect the rate of contribution of the error pattern k to the total error rate.

This can also be understood from FIG. 6, which shows that the frequency ($F_1$, $F_2$, and $F_3$) of occurrence of samples less than the threshold value Th_k is decreased in order of $MD_1$, $MD_2$, and $MD_3$ in which order the rate of contribution is lowered.

When the occurrence frequencies $F_1$, $F_2$, and $F_3$ thus obtained for the respective error patterns k reflect the rates of contribution of the respective error patterns k, an evaluation index correlated to the total error rate can be obtained by simply adding together the values of the occurrence frequencies $F_1$, $F_2$, and $F_3$.

Thus, in the present embodiment, an individual threshold value Th_k (Th__1, Th__2, and Th__3) obtained by dividing a Euclidean distance $d_k^2$ in each error pattern k by a common value is set, the number (frequency of occurrence) of values of metric difference MD which values are less than the individual threshold value Th_k is counted for each error pattern k, and a sum of the numbers is obtained. It is thereby possible to obtain an evaluation index reflecting the rate of contribution of each error pattern k to the total error rate and correlated well with the total error rate.

The evaluation index thus obtained according to the present embodiment will hereinafter be referred to as an evaluation value Pq.

For confirmation, while the evaluation value Pq according to the embodiment as information on the sum of occurrence frequencies as described above can be converted into probability information by being divided by the value of a total number of samples of metric differences MD, the calculation involving such a division by the total number of samples is not necessarily required. For example, when an evaluation is to be performed on a plurality of optical disks 100, and the number of metric differences MD to be sampled is set to a common value in advance, the evaluation value Pq as a simple sum of occurrence frequencies as described above can be used as a signal quality evaluation index for each disk 100 as it is because the evaluation value Pq can be treated as a numerical value obtained on the same evaluation basis.

Next, returning to FIG. 2, description will be made of a configuration of the signal evaluating circuit 9 for calculating the evaluation index according to the present embodiment by the above-described method.

The signal evaluating circuit 9 in FIG. 2 includes: an enabler 31 for outputting a signal enable on the basis of the path selection result information SP; a maximum likelihood path generating circuit 32 and a second path generating circuit 33 for generating a maximum likelihood path Pa and a second path Pb; a delay compensating circuit 34 for compensating for a delay of the reproduced signal RF (RFEQ) from the PRML decoder 8; a Euclidean distance calculating circuit 35 for calculating a Euclidean distance $d_k^2$ on the basis of the maximum likelihood path Pa and the second path Pb; and a metric difference calculating circuit 36 for calculating a metric difference MD on the basis of the maximum likelihood path Pa, the second path Pb, and a reproduced signal X from the delay compensating circuit 34.

The signal evaluating circuit 9 further includes: a threshold value setting circuit 37 for generating a threshold value Th_k by dividing the Euclidean distance $d_k^2$ calculated by the Euclidean distance calculating circuit 35 by a predetermined value; a comparator 38 for comparing the threshold value Th_k and a metric difference MD with each other; a counter 39 for performing counting operation according to a result of the comparison by the comparator 38; a sample count measuring circuit 40 for measuring the number of samples on the basis of the signal enable from the enabler 31; and an evaluation value generating circuit 41 for generating an evaluation value Pq on the basis of the count values of the counter 39 and the sample count measuring circuit 40.

The enabler 31 is provided to operate each part only at times of a predetermined plurality of error patterns k set in advance, and thereby implement a control function for preventing samples for other error patterns from being mixed in.

The enabler 31 determines whether or not a relation between the maximum likelihood path Pa and the second path Pb corresponds to one of the predetermined plurality of error patterns k set in advance on the basis of the path selection result information SP output from the path selection result information outputting part 24a in the path memory updating unit 24 in the PRML decoder 8 described earlier. The enabler 31 outputs a signal enable according to a result of the determination.

As described earlier, the information of the bit sequences of the maximum likelihood path Pa and the second path Pb is obtained in a process of path selection in the path memory updating unit 24. Accordingly, the path memory updating unit 24 in the PRML decoder 8 in this case is provided with the path selection result outputting part 24a to supply the information of the respective bit sequences of the maximum likelihood path Pa and the second path Pb as path selection result information SP to the signal evaluating circuit 9.

The enabler 31 compares the information of the bit sequences of the maximum likelihood path Pa and the second path Pb as the path selection result information SP. The enabler 31 can thereby determine whether or not the error pattern between the maximum likelihood path Pa and the second path Pb corresponds to one of the predetermined error patterns set in advance.

Such a determination process in the enabler 31 can be realized by the following method, for example.

For example, in a case of a two-bit error caused by a shift of a shortest mark when PR(1, 2, 2, 2, 1) is employed, fifth bits and seventh bits in the bit sequences of the two paths, that is, the maximum likelihood path Pa and the second path Pb are different from each other, and at least first to eleventh bits other than the fifth bits and the seventh bits in the bit sequences of the two paths coincide with each other. Thus, bit positions at which the bits coincide with each other or do not coincide with each other can be identified according to the error pattern. It is accordingly possible to determine whether a type of error of the bit sequence of the second path Pb with respect to the bit sequence of the maximum likelihood path Pa is a predetermined error type of interest on the basis of a result of determination of whether the values at the bit positions thus identified according to the predetermined error pattern of interest coincide with each other or do not coincide with each other.

The enabler 31 outputs the signal enable only when the error pattern between the maximum likelihood path Pa and the second path Pb corresponds to one of the predetermined plurality of error patterns. The enabler 31 thereby activates each part supplied with the signal enable.

Though not shown in the figure, the signal enable is supplied to each part within the signal evaluating circuit 9. That is, with such a configuration, each part is activated only when the error pattern of the second path Pb with respect to the maximum likelihood path Pa is a pattern of interest. Consequently, an operation for calculating the evaluation value Pq can be prohibited when the error pattern is not of interest. In other words, samples of error patterns that are not of interest can be prevented from being mixed in the calculation of the evaluation value Pq.

Incidentally, it suffices in this case to prohibit a result of comparison based on a Euclidean distance $d^2$ and a metric difference MD for a maximum likelihood path Pa and a second path Pb having an error pattern that is not of interest from being reflected in the calculation of the evaluation value. Therefore, based on this idea, the objective is achieved when the signal enable is supplied to at least the comparator 38.

The maximum likelihood path generating circuit 32 is supplied with the binarized signal DD as a result of bit detection of the PRML decoder 8. The maximum likelihood path generating circuit 32 reproduces an intersymbol interference by performing a convolution operation on the binarized signal DD using predetermined coefficients ((1, 2, 2, 1) or (1, 2, 2, 2, 1) in this case) according to a PRML class used in the PRML decoder 8. The maximum likelihood path generating circuit 32 thereby generates a maximum likelihood path Pa as the partial response sequence of the binarized signal DD.

The generated maximum likelihood path Pa is supplied to the Euclidean distance calculating circuit 35 and the metric difference calculating circuit 36.

The second path generating circuit 33 generates a second path Pb on the basis of the binarized signal DD and the path selection result information SP from the path selection result information outputting part 24a described above. That is, the second path generating circuit 33 generates the second path Pb as a partial response sequence by performing a similar operation to that of the maximum likelihood path generating circuit 32 described above on the information of the bit sequence of the second path Pb included in the path selection result information SP.

The second path Pb is also supplied to the Euclidean distance calculating circuit 35 and the metric difference calculating circuit 36.

The Euclidean distance calculating circuit 35 is supplied with the maximum likelihood path Pa and the second path Pb, and calculates a Euclidean distance $d_k^2$ between the maximum likelihood path Pa and the second path Pb.

Specifically, letting $PA_i$ and $PB_i$ be values in the maximum likelihood path Pa and the second path Pb, respectively, in same sampling timing, the Euclidean distance calculating circuit 35 performs the calculation by Equation 3 shown earlier.

The metric difference calculating circuit 36 is supplied with the maximum likelihood path Pa and the second path Pb, and also supplied with the reproduced signal RF (PREQ) via the delay compensating circuit 34.

In this case, the delay compensating circuit 34 synchronizes the reproduced signal RF (PREQ) with timing of the maximum likelihood path Pa and the second path Pb, and inputs the reproduced signal RF (PREQ) to the metric difference calculating circuit 36 (X in FIG. 2).

The metric difference calculating circuit 36 calculates the metric difference MD described earlier on the basis of the maximum likelihood path Pa, the second path Pb, and the reproduced signal RF(X). Specifically, letting $PB_i$, $PA_i$, and $R_i$ be the respective values of the second path Pb, the maximum likelihood path Pa, and the reproduced signal RF(X) in same sampling timing, the metric difference calculating circuit 36 performs the calculation by Equation 2 shown earlier.

The threshold value setting circuit 37 is supplied with the value of the Euclidean distance $d_k^2$ from the Euclidean distance calculating circuit 35 to generate a threshold value Th_k by multiplying the Euclidean distance $d_k^2$ by a predetermined coefficient (½ in this case) set in advance. That is, the individual threshold value Th_k (Th_1, Th_2, and Th_3) obtained by dividing the Euclidean distance $d_k^2$ in each error pattern k by a common value is thereby set.

The comparator 38 is supplied with the value of the metric difference MD calculated by the metric difference calculating circuit 36 and the threshold value Th_k generated by the threshold value setting circuit 37. The comparator 38 increments the value of the counter 39 in the subsequent stage only when MD<Th_k.

As a result of the operations of the comparator 38 and the counter 39, the information of a total number (frequency of occurrence) of values of metric difference MD less than the threshold value Th_k in each error pattern k can be obtained.

The sample count measuring circuit 40 is supplied with the signal enable from the enabler 31 after the signal enable branches out. The sample count measuring circuit 40 measures the number of times that the signal enable is supplied. As a result of such an operation of the sample count measuring circuit 40, a total number of samples of metric differences MD for a predetermined plurality of error patterns of interest can be counted.

The evaluation value generating circuit 41 generates an evaluation value Pq on the basis of the count value of the counter 39 and the value of the total number of samples from the sample count measuring circuit 40.

In this case, the evaluation value generating circuit 41 is configured to output, as the evaluation value Pq, the value of the counter 39 when the value of the total number of samples becomes a predetermined value m.

With such a configuration, the total number of values of metric difference MD to be sampled in evaluation of a plurality of optical disks 100 can be made to be a common value as the predetermined value m. That is, evaluation values Pq calculated for a plurality of optical disks 100 as described above can thereby be treated as evaluation indexes on the same basis as they are.

Incidentally, in converting the evaluation value Pq as a total number of metric differences MD<Threshold Value Th_k into probability information, it suffices to output a value obtained by dividing the value of the counter 39 by the above-described total number (m) of samples when the value of the number of samples from the sample count measuring circuit 40 has become the predetermined value m.

As is understood from the configuration of the evaluating device 7 according to the present embodiment as described above, the evaluation value Pq according to the embodiment which value correlates well with the total error rate can be obtained by a very simple configuration that only counts the number of samples "MD<Threshold Value Th_k" obtained for each error pattern k in this case, without requiring any complex calculation using a square calculation, a square root calculation and the like as in a case of obtaining a statistical index such as a conventional variance value or the like.

In addition, the trouble of determining a rate of contribution of each error pattern k is not needed, which also simplifies the calculation.

Thus, according to the present embodiment, when a plurality of error patterns contribute to occurrence of errors, an evaluation index that properly reflects the rate of contribution of each error pattern to the total error rate and correlates well with the total error rate can be calculated by a very simple configuration.

Second Embodiment

A second embodiment of the present invention will next be described.

FIG. 7 is a block diagram showing an internal configuration of an evaluating device 7 according to the second embodiment.

While in the foregoing first embodiment, the path selection result information SP indicating an actual path selection result is referred to identify an error pattern between a maximum likelihood path Pa and a second path Pb, the second embodiment identifies the error pattern on the basis of a pattern table.

Incidentally, in FIG. 7, parts already described in the first embodiment are identified by the same reference numerals, and description thereof will be omitted. Description will principally be made of only differences.

In a PRML decoder 8 in this case, the path selection result outputting part 24*a* provided in the path memory updating unit 24 is omitted.

A signal evaluating circuit 9 is provided with a pattern detecting circuit and pattern table 50 shown in FIG. 7. The pattern detecting circuit and the pattern table that the pattern detecting circuit refers to are shown integrally as the pattern detecting circuit and pattern table 50.

The pattern table in the pattern detecting circuit and pattern table 50 stores, in correspondence with a predetermined plurality of error patterns of interest in calculating an evaluation value Pq, patterns of bit sequences of the maximum likelihood path Pa and the second path Pb assumed when the errors occur in association with each other.

The pattern detecting circuit compares the value of a binarized signal DD input as shown in FIG. 7 with the value of the bit sequence of the maximum likelihood path Pa stored in the pattern table to determine whether these values coincide with each other.

When the pattern detecting circuit determines that the binarized signal DD coincides with the stored bit sequence of the maximum likelihood path Pa, the binarized signal DD is the maximum likelihood path Pa in one of the predetermined plurality of error patterns. Accordingly, the pattern detecting circuit supplies a second path generating circuit 33 with the pattern of the bit sequence of the second path Pb stored in association with the pattern of the binarized signal DD in the pattern table as a second pattern P2 shown in FIG. 7.

Since the information of the bit sequence of the second path Pb as the second pattern P2 is supplied, the second path generating circuit 33 in this case can also generate the second path Pb.

With this, in response to the determination that the binarized signal DD coincides with the stored bit sequence of the maximum likelihood path Pa as described above, the pattern detecting circuit outputs a signal enable for activating each part within the signal evaluating circuit 9.

Thus, also in this case, an operation for calculating the evaluation value is performed only when the error pattern is an error pattern of interest. That is, a result of comparison based on a metric difference MD and a Euclidean distance $d_k^2$ for a maximum likelihood path Pa and a second path Pb having an error pattern that is not of interest can be prohibited from being reflected in the calculation of the evaluation value Pq.

Thus, in the second embodiment, since the patterns of the bit sequences of the maximum likelihood path Pa and the second path Pb assumed in error patterns of interest are stored in advance, it can be assumed that the error pattern between the maximum likelihood path Pa and the second path Pb is an error pattern of interest when the stored pattern of a bit sequence of the maximum likelihood path Pa coincides with the pattern of the binarized signal DD. In addition, at the same time, the information of the bit sequence of the second path Pb associated with the maximum likelihood path Pa can be obtained.

When the path selection result information SP is used as in the foregoing first embodiment, whether a maximum likelihood path Pa and a second path Pb constituting a set error pattern are actually obtained can be determined reliably from the information of the bit sequences of the maximum likelihood path Pa and the second path Pb obtained within the path memory updating unit 24. On the other hand, in the second embodiment using the pattern table, whether a relation between the maximum likelihood path Pa and the second path Pb corresponds to an error pattern of interest is not actually confirmed, and therefore reliability may be degraded in this respect.

However, the method using the pattern table has an advantage of eliminating a need for modifying the PRML decoder 8 because the path selection result outputting part 24*a* for outputting the path selection result information SP as described above can be omitted.

Third Embodiment

The first embodiment and the second embodiment have been described thus far supposing that fixed values of reference levels are set in the PRML decoder 8. That is, the first embodiment and the second embodiment have been described supposing that fixed values corresponding to an employed PR type are set as values of reference levels used for branch metric calculation.

Recently, however, an adaptive type Viterbi technology that dynamically changes reference levels according to a reproduced signal has been proposed and started to be used as an improved technology of a Viterbi detector using such fixed reference levels.

Accordingly, a third embodiment proposes a configuration of an evaluating device 7 corresponding to a case where a configuration of such an adaptive type Viterbi detector is employed.

An outline of such an adaptive type Viterbi technology will first be described with reference to FIGS. 9A and 9B.

Figure 9A:
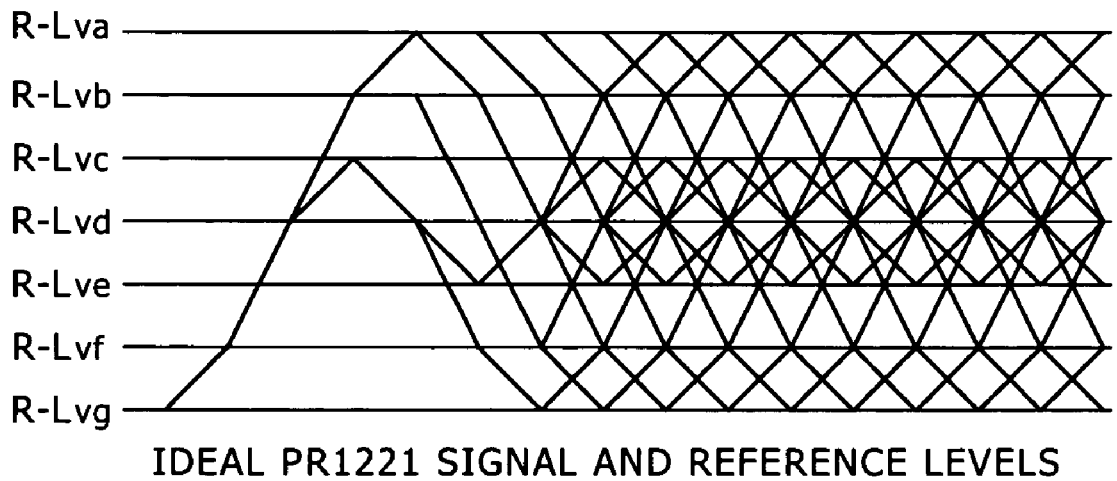
FIGS. 9A and 9B are diagrams of assistance in explaining adaptive type Viterbi technology.
Figure 9B:
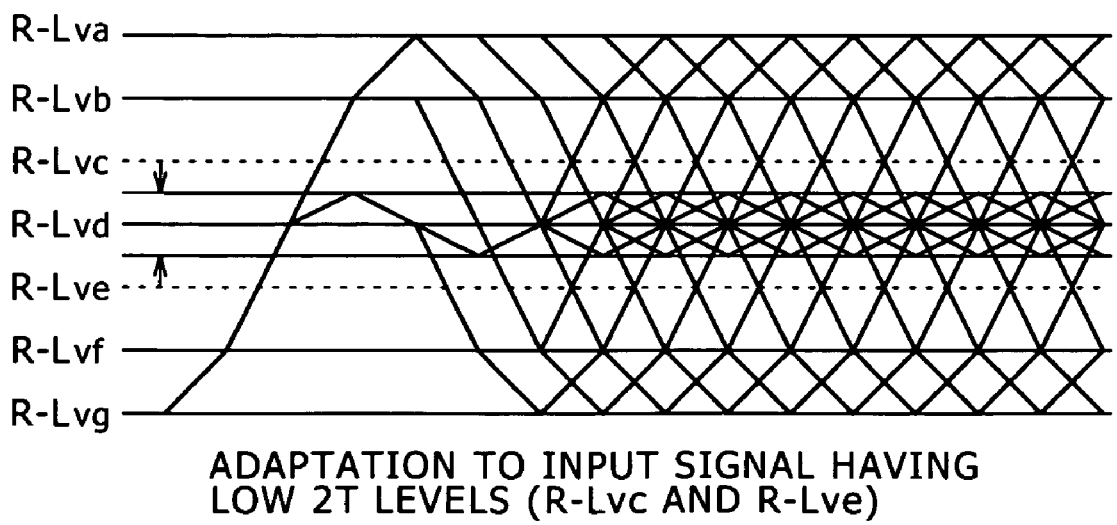

FIGS. 9A and 9B show relation between reference levels set in a Viterbi detector (PRML detector 8) and a reproduced signal (eye pattern) when PR(1, 2, 2, 1), for example, is employed as a partial response type.

FIG. 9A shows a case where the amplitude levels in the reproduced signal of mark lengths corresponding respectively to the reference levels (R-Lva to R-Lvg in the figure) in PR employed by the Viterbi detector are ideal levels expected in the PR type.

On the other hand, FIG. 9B shows a case where a sufficient amplitude cannot be obtained for a reproduced signal of a shortest mark length, in particular, as for example the recording density of the recording medium is increased.

In such a case, each reference level (the reference level R-Lvc and the reference level R-Lve represented by broken lines in FIG. 9B) to be set in correspondence with the shortest mark length becomes a shifted value with respect to ideal signal amplitude levels. Thus, a reproduced signal waveform different from an ideal waveform expected in the PR is obtained, and correspondingly the reference levels are shifted. An error therefore occurs in a branch metric calculated on the basis of the reference levels. Thereby an error may also be caused in a result of detection of the Viterbi detector.

Accordingly, the adaptive type Viterbi detection technology generates reference levels according to an actual reproduced signal, and uses the reference levels for branch metric calculation to suppress errors in the bit detection result.

Figure 8:
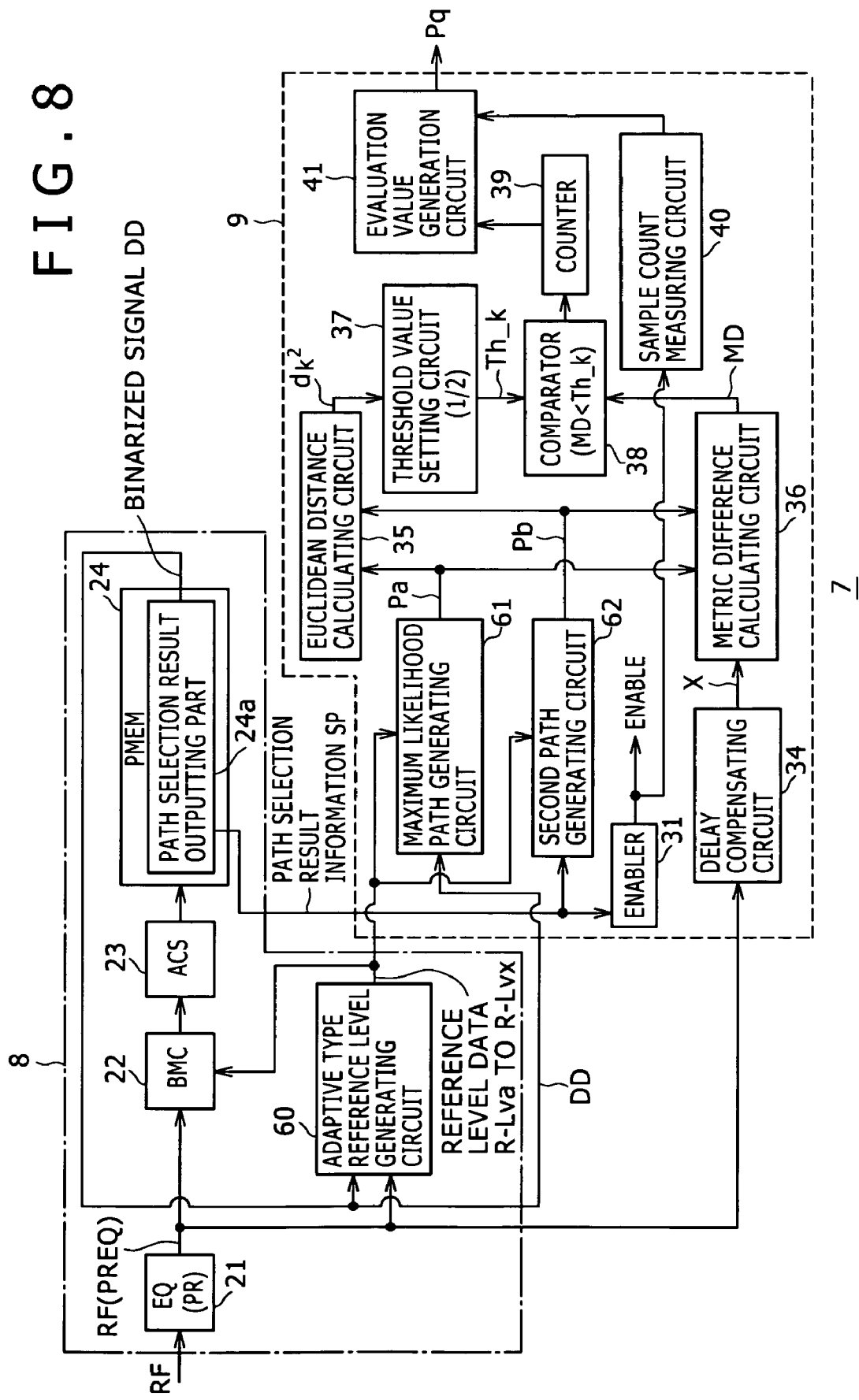
FIG. 8 is a block diagram showing an internal configuration of an evaluating device according to a third embodiment.

FIG. 8 shows a configuration within the evaluating device 7 according to the third embodiment corresponding to a case where such an adaptive type Viterbi technology is introduced.

Incidentally, also in FIG. 8, parts already described in FIG. 1 are identified by the same reference numerals, and description thereof will be omitted.

The evaluating device 7 in this case is provided with an adaptive type reference level generating circuit 60 within the PRML decoder 8.

The adaptive type reference level generating circuit 60 generates reference level data R-Lva to R-Lvx to be set in a branch metric calculating unit 22 on the basis of a reproduced signal RF from an equalizer 21 and a binarized signal DD from a path memory updating unit 24 as described above.

Specifically, the adaptive type reference level generating circuit 60 in this case is provided with x low-pass filters disposed according to the number (a to x) of reference levels set in correspondence with an employed PR class. The value of the reproduced signal RF is divided according to the pattern of the binarized signal DD and input to these low-pass filters, whereby the value of the reproduced signal RF is averaged for each reference level. The result is output as reference level data R-Lva to R-Lvx.

As described above, the adaptive type Viterbi technology divides the value of the reproduced signal RF for each of reference levels (R-Lva to R-Lvx), calculates average values for the respective reference levels, and obtains these average values as reference level data R-Lva to R-Lvx to be actually set. As a result of such an operation, the reference levels R-Lvc and R-Lve in the foregoing example of FIG. 9B, for example, are changed to levels represented by respective solid lines according to the waveform of the actual reproduced signal RF, that is, to the average values of amplitude levels of corresponding waveform components. It is thereby possible to set the reference levels adapted to the actual reproduced signal RF.

Since the reference level data R-Lv adapted to the actual reproduced signal RF can be thus obtained, a correct value can be obtained as a branch metric calculated in the branch metric calculating unit 22 even when an ideal reproduced signal RF expected in the PR class is not obtained. Thus, the reliability of the binarized signal DD can be ensured.

Incidentally, while FIGS. 9A and 9B illustrate a case where the amplitude of the shortest mark is reduced, there is a case where an ideal reproduced signal RF cannot be obtained because of asymmetry, for example. Also in this case, the above-described adaptive type reference level generating circuit 60 operates so that the values of the reference level data R-Lv are changed according to the actual reproduced signal RF so as to follow the actual reproduced signal RF. Therefore the reference levels adjusted to the respective amplitude levels of the reproduced signal RF can be set. That is, such asymmetry can be dealt with to ensure the reliability of the binarized signal DD.

Incidentally, a configuration for implementing such an adaptive type Viterbi detection method is also described in Japanese Patent No. 3033238, for example.

In the case where such an adaptive type Viterbi detection method is employed, the maximum likelihood path Pa and the second path Pb cannot be generated properly when the maximum likelihood path generating circuit 32 and the second path generating circuit 33 provided in the foregoing embodiments are provided as they are as the configuration for generating the maximum likelihood path Pa and the second path Pb in the signal evaluating circuit 9.

Specifically, the maximum likelihood path generating circuit 32 and the second path generating circuit 33 provided in the foregoing embodiments reproduce the maximum likelihood path Pa and the second path Pb as partial response sequences using fixed coefficients ((1, 2, 2, 1) or (1, 2, 2, 1)) corresponding to the PR class employed in the PRML decoder 8 in response to input of the binarized signal DD and the information of the bit sequence of the second path Pb, respectively. In adaptive type Viterbi, however, the reference levels are not fixed but changed according to the reproduced signal, as described above. Thus, when such fixed coefficients are used, path information cannot be reproduced properly.

Accordingly, the signal evaluating circuit 9 according to the third embodiment is provided with a maximum likelihood path generating circuit 61 and a second path generating circuit 62 configured to reproduce the maximum likelihood path Pa and the second path Pb, respectively, on the basis of input of the reference level data R-Lva to R-Lvx from the adaptive type reference level generating circuit 60.

The maximum likelihood path generating circuit 61 is supplied with the adaptive type reference level data R-Lva to R-Lvx as values corresponding to the values of respective branches in the PRML decoder 8 and the binarized signal DD.

The maximum likelihood path generating circuit 61 checks the binarized signal DD input thereto to determine a branch corresponding to a bit sequence of the binarized signal DD.

Then, the maximum likelihood path generating circuit 61 selects one of the reference levels R-Lva to R-Lvx which level corresponds to the determined branch, and outputs the reference level. By performing this operation at each time, the maximum likelihood path generating circuit 61 can reproduce a proper maximum likelihood path Pa obtained by dealing with change in the values of the adaptive type reference level data R-Lva to R-Lvx from the values of the fixed reference levels.

Also in this case, the information of the generated maximum likelihood path Pa is supplied to a Euclidean distance calculating circuit 35 and a metric difference calculating circuit 36.

The second path generating circuit 62 is supplied with the reference level data R-Lva to R-Lvx as with the maximum likelihood path generating circuit 61, and also supplied with path selection result information SP from a path selection result outputting part 24a.

The second path generating circuit 62 generates a second path Pb by performing a similar operation to that of the maximum likelihood path generating circuit 61 on the basis of the information of the bit sequence of the second path Pb included in the path selection result information SP and the reference level data R-Lva to R-Lvx. Specifically, the second path generating circuit 62 performs an operation at each time of checking the information of the bit sequence of the second path Pb to determine a branch corresponding to the bit sequence, and selecting and outputting one of the reference levels R-Lva to R-Lvx which level corresponds to the determined branch. Thereby the second path generating circuit 62 can reproduce a proper second path Pb obtained by dealing with change in the values of the adaptive type reference level data R-Lva to R-Lvx from the values of the fixed reference levels.

The information of the second path Pb is also supplied to the Euclidean distance calculating circuit 35 and the metric difference calculating circuit 36.

With the above-described configuration, it is possible to generate a proper maximum likelihood path Pa and a proper second path Pb even when the adaptive type Viterbi technology is introduced, and calculate the evaluation value Pq on the basis of the maximum likelihood path Pa and the second path Pb as in the case of the first embodiment.

Fourth Embodiment

Figure 10:
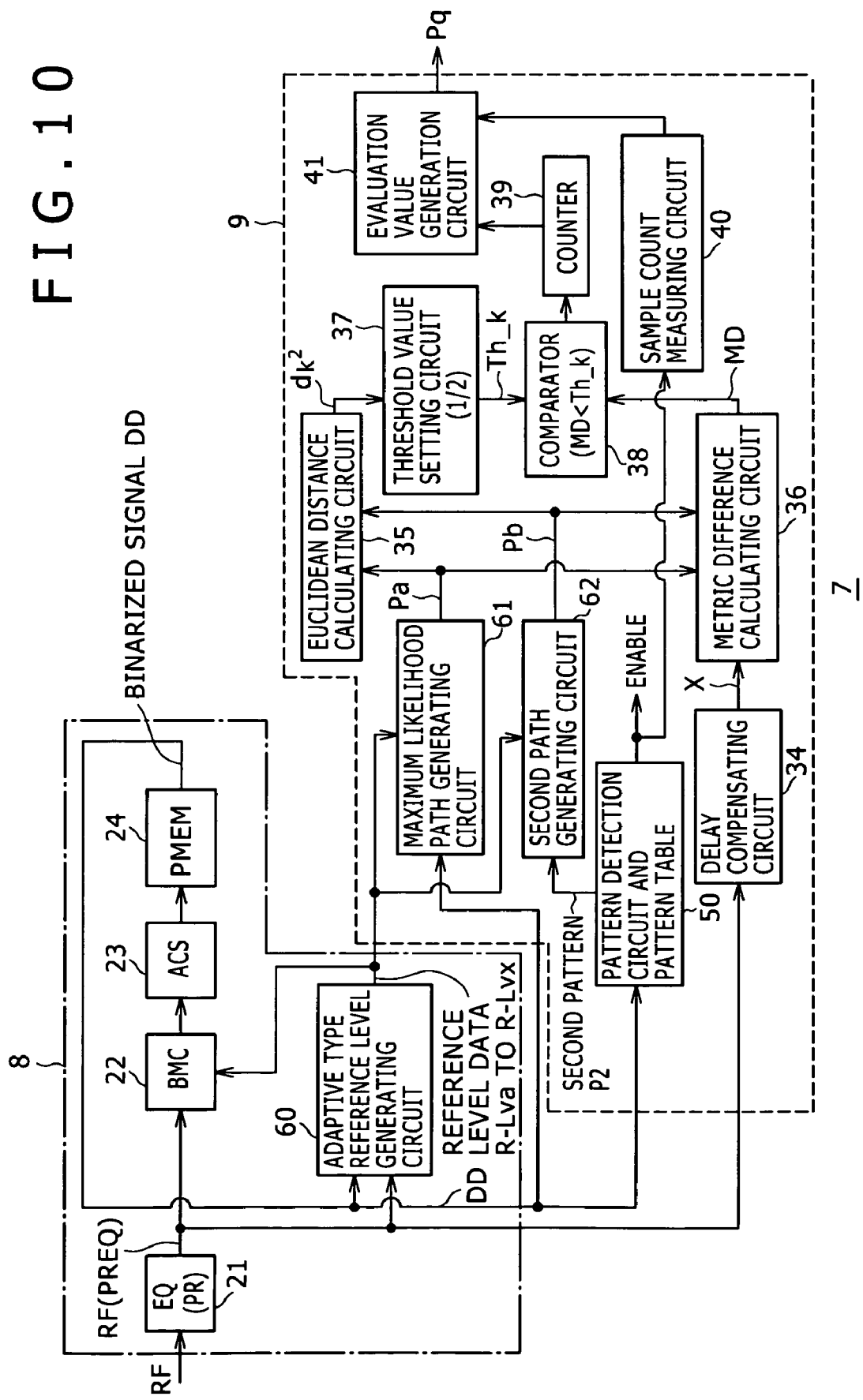
FIG. 10 is a block diagram showing an internal configuration of an evaluating device according to a fourth embodiment.

FIG. 10 shows a configuration of an evaluating device 7 according to a fourth embodiment.

The fourth embodiment employs a configuration ready for adaptive type Viterbi as described in the third embodiment, and performs determination for error patterns of interest using a pattern table as in the second embodiment.

The evaluating device 7 according to the fourth embodiment is changed from the evaluating device 7 according to the third embodiment in that the path selection result outputting part 24a in the path memory updating unit 24 is omitted in the evaluating device 7 according to the fourth embodiment, and instead a pattern detecting circuit and pattern table 50 similar to that used in the foregoing second embodiment is provided in the evaluating device 7 according to the fourth embodiment.

In this case, a second path generating circuit 62 is supplied with the information of a second pattern P2 read on the basis of a binarized signal DD in the pattern detecting circuit and pattern table 50. Also in this case, the second path generating circuit 62 can generate a proper second path Pb according to reference level data R-Lva to R-Lvx changed from ideal values on the basis of the second pattern P2 and the adaptive type reference level data R-Lva to R-Lvx.

Fifth Embodiment

The foregoing embodiments obtain an evaluation value Pq, which is a sum of the number of samples MD<Th_k for each error pattern k, as a signal quality evaluation index correlating well with a total error rate. However, such an evaluation value Pq is an index only correlating with the total error rate, and does not indicate the bit error rate bER itself.

Accordingly, a fifth embodiment calculates the value of the total bit error rate bER from the evaluation value Pq.

Returning to FIG. 4 described earlier and reconsidering the concept of the evaluation value Pq according to the embodiment, the evaluation value Pq corresponds to the frequency of occurrence of metric differences MD such that $0 \leq MD < $ Threshold Value Th_k, as represented by the area of a part Fk in the figure. The bit error rate bER corresponds to the area of a part E where MD<0.

When the value of the evaluation value Pq is calculated, the area of the part Fk in the distribution MDk in FIG. 4 is known. Hence, it is understood that when a relation between the areas of the parts Fk and E in the distribution MDk can be defined, the bit error rate bER can be obtained from the evaluation value Pq.

Figure 11:
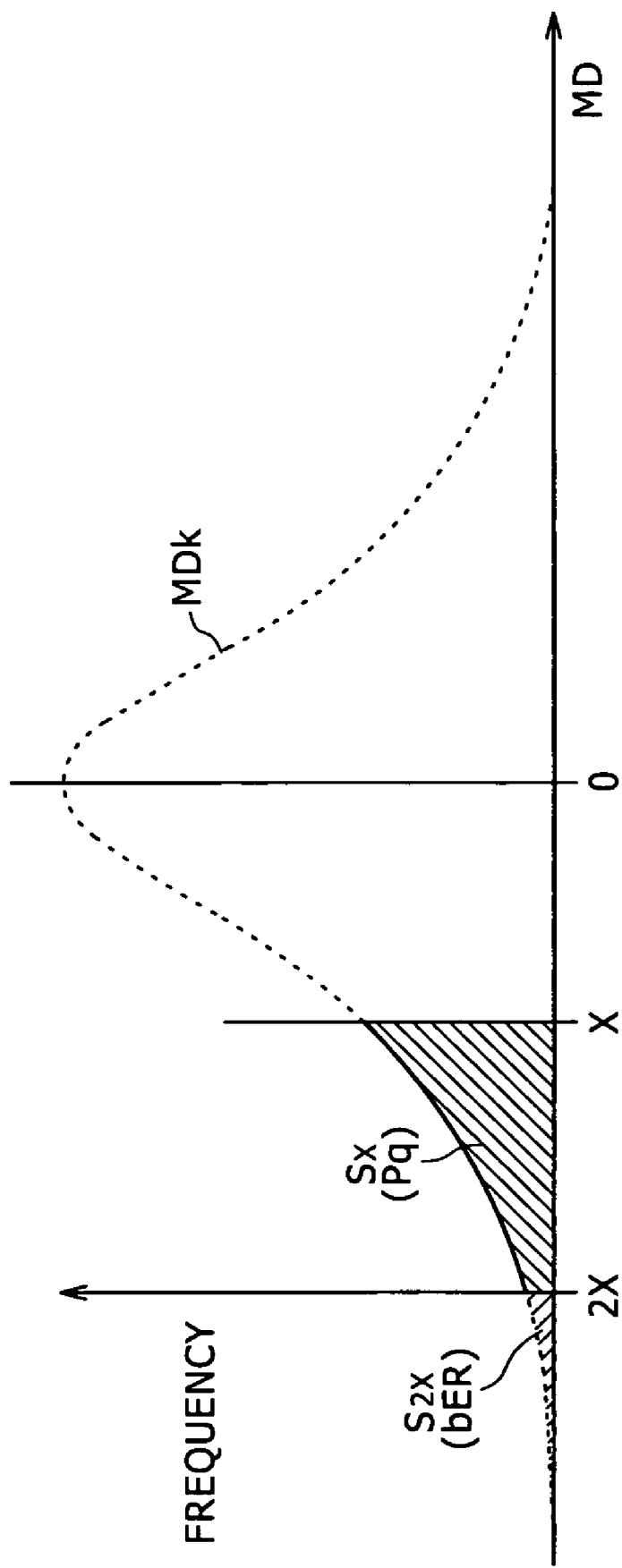
FIG. 11 is a diagram of assistance in explaining relation between an evaluation value (Pq) and a bit error rate (bER) according to an embodiment.

When the value of the Euclidean distance $d_k^2$ as the average value of the distribution MDk shown in FIG. 4 is replaced with zero, and the value of the threshold value Th_k for metric differences MD is replaced with X, relation between the elements in the distribution MDk can be expressed as shown in FIG. 11.

In FIG. 11, since the threshold value Th_k=½ $d_k^2$ in the present embodiment, when the Euclidean distance $d_k^2$ as the average value of the distribution MDk is replaced with zero, and the value of the threshold value Th_k is replaced with X, as described above, a detection error boundary part represented by MD=0 in FIG. 4 becomes 2X. In correspondence with the thus changing of the threshold value Th_k to X and the part of MD=0 to 2X, the part denoted as Fk in FIG. 4 (that is, Pq) is represented as $S_X$, and the part denoted as E where MD<0 (that is, bER) is represented as $S_{2X}$, as shown in FIG. 11.

When the elements of the average value of the distribution MDk, the threshold value Th_k, and the detection error part (MD=0) are denoted as shown in FIG. 11, a relation between the areas $S_X$ (Fk) and $S_{2X}$ (E) can be defined by the following Equation 4 using an error function (complementary error function) erfc with the above X as a parameter.

$$\{Pq, bER\} = \{A \times erfc(X), A \times erfc(2X)\} (X>0, A=\text{const.}) \quad \text{[Equation 4]}$$

The complementary error function erfc can be expressed by the following Equation 5.

$$erfc(x) = \frac{2}{\sqrt{\Pi}} \int_x^\infty \exp(-t^2) dt \quad \text{[Equation 5]}$$

Since the relation between $S_X$ (Fk) as the evaluation value Pq according to the embodiment and $S_{2X}$ (E) as the bit error rate bER can be defined, the bit error rate bER can be correctly estimated from the evaluation value Pq.

Specifically, as to A and X as two variables in this case, the value of A as a normal distribution amplitude parameter is unknown, and is thus set tentatively at a value α. With A=α, the value of X is changed in predetermined increments, for example in increments of 0.1, and the values of A×erfc(X) and A×erfc(2X) into which X=0.1, 0.2, 0.3 . . . is substituted are each calculated.

Figure 12:
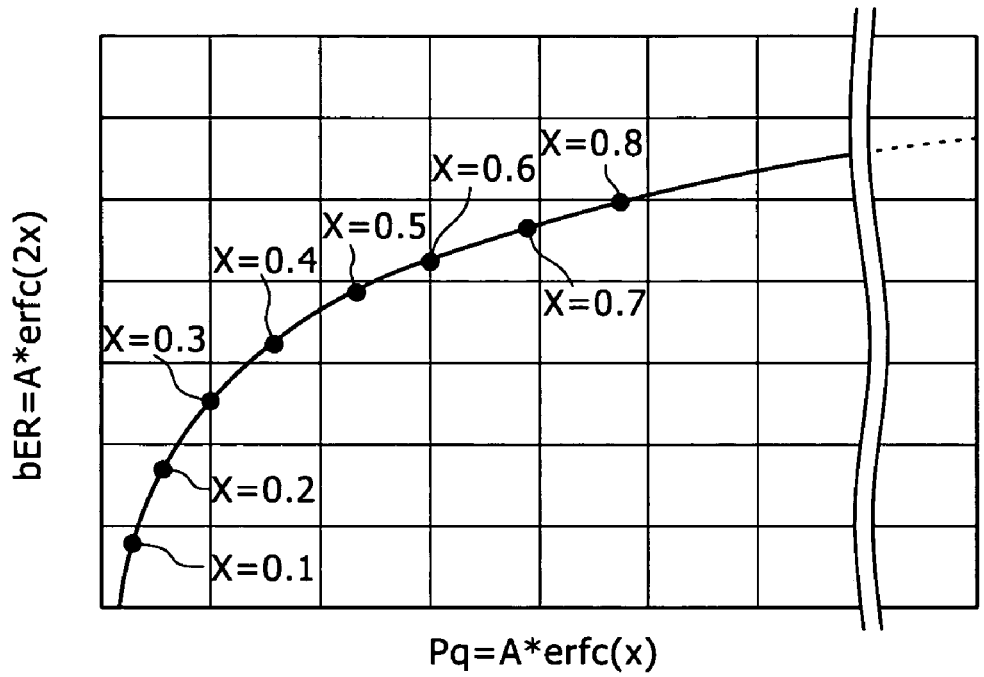
FIG. 12 is a diagram showing, in the form of a graph, the correspondence between the evaluation value (Pq) and the bit error rate (bER) which correspondence is defined in the embodiment.

Then, as shown in FIG. 12, for example, a relation between the evaluation value Pq and the bit error rate bER when X=0.1, 0.2, 0.3 . . . is substituted can be plotted. From this result, the relation between the evaluation value Pq and the bit error rate bER can be expressed.

However, the value of the amplitude parameter A remains unknown in this stage. Therefore, unless this value cannot be determined, the relation between the evaluation value Pq and the bit error rate bER cannot be defined properly.

For the value of the amplitude parameter A, fitting needs to be performed on the basis of an evaluation value Pq obtained for an optical disk 100 whose bit error rate bER is known in advance.

That is, the value of A is set at a certain value α in the above description. However, the value of A is also changed, and the values of A×erfc(X) and A×erfc(2X) are each calculated. Then, a plurality of curves (that is, correspondences between Pq and bER) as shown in FIG. 12 are obtained. Of these curves, a curve where a relation between the value of the bit error rate bER known in advance as described above and the value of the evaluation value Pq obtained for the optical disk 100 is obtained is identified. The value of A set at this time is determined.

When the correct relation between the evaluation value Pq and the bit error rate bER is thus determined, and the correspondence relation is stored in storage means such for example as a ROM, the calculated evaluation value Pq can be correctly converted into the bit error rate bER on the basis of the contents stored in the storage means.

Figure 13:
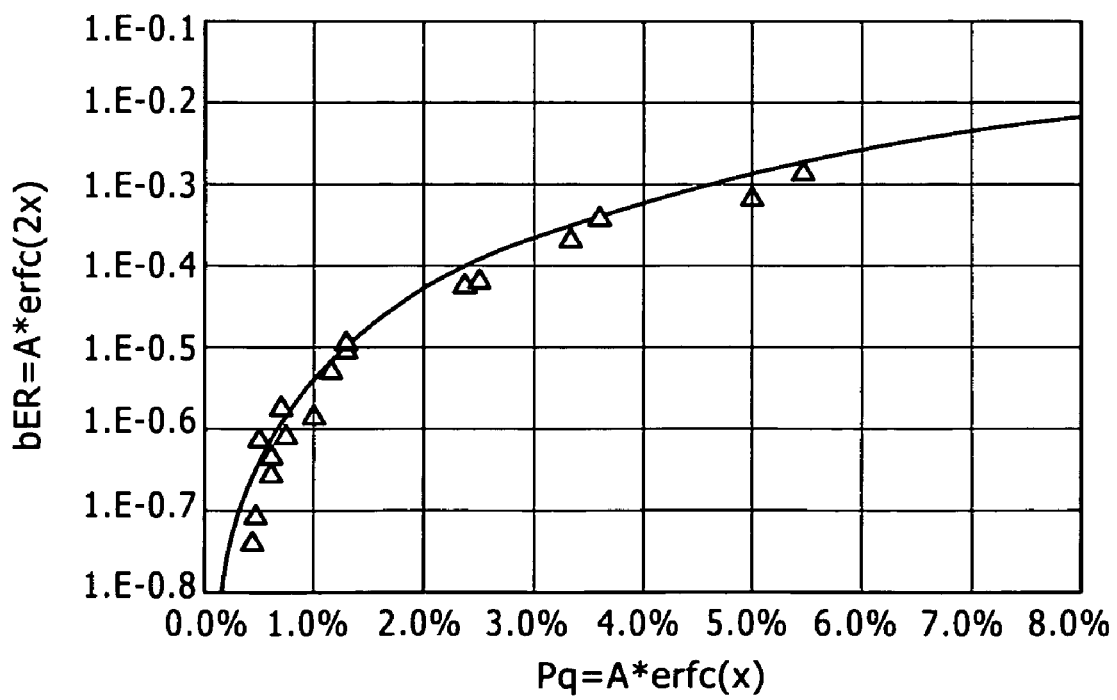
FIG. 13 is a diagram showing, in the form of a graph, a result of comparison between the correspondence between the evaluation value (Pq) and the bit error rate (bER) which correspondence is defined in the embodiment and actual correspondences between evaluation values (Pq) and bit error rates (bER)

FIG. 13 shows a result of an experiment conducted with a relation between correspondence (a curve in the figure) between the evaluation value Pq and the bit error rate bER when actual fitting is performed by the above-described process and relation between evaluation values Pq obtained for a plurality of optical disks 100 whose bit error rates bER are known in advance and the bit error rates bER of the plurality of optical disks 100.

Incidentally, FIG. 13 shows the result of the experiment when PR(1, 2, 2, 1) is employed as a PR class, and when error patterns of interest are limited to three error patterns with smallest Euclidean distances $d_k^2$ between the maximum likelihood path Pa and the second path Pb. In FIG. 13, the evaluation value Pq is shown as a value converted into percentage on the basis of a total number (predetermined value m) of samples of metric differences MD.

The value of the amplitude parameter A at that time was 0.7 as a result of the fitting.

As is understood from this experimental result, the correspondence between the evaluation value Pq and the bit error rate bER according to the embodiment which correspondence is obtained by the above-described process substantially coincides with the correspondences between the actual evaluation values Pq and the actual bit error rates bER, and thus properly represents the relation between the evaluation value Pq and the bit error rate bER.

That is, the information on the correspondence according to the present embodiment indicates that the bit error rate bER can be estimated correctly from the calculated evaluation value Pq.

Figure 14:
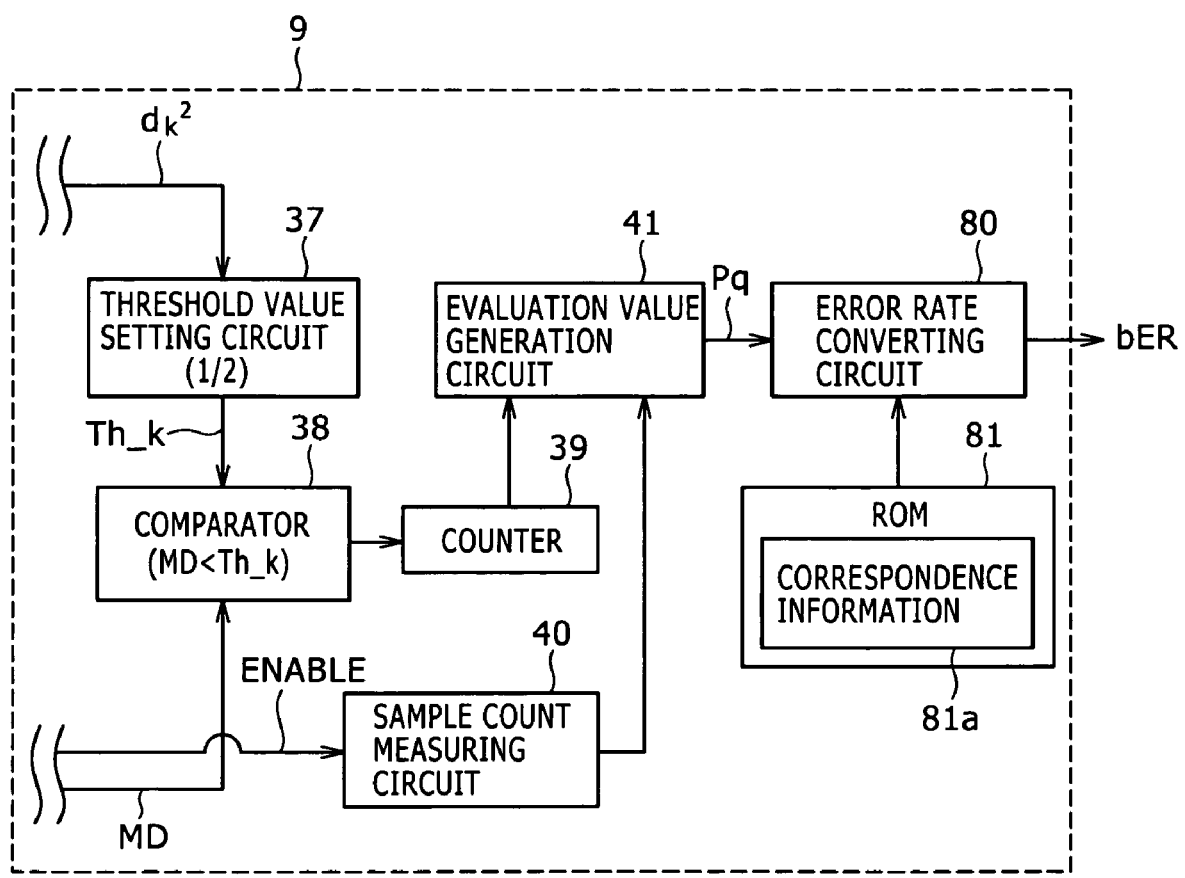
FIG. 14 is a block diagram mainly showing a configuration for calculating the bit error rate (bER) from the evaluation value (Pq) as an internal configuration of an evaluating device according to the fifth embodiment.

FIG. 14 shows an internal configuration of a signal evaluating circuit 9 when the bit error rate bER is calculated from the evaluation value Pq on the basis of the above-described information on the correspondence.

Incidentally, in FIG. 14, a configuration for generating a metric difference MD, a Euclidean distance $d_k^2$, and a signal enable is omitted, and only a configuration in a subsequent stage is extracted and shown. Also in FIG. 14, parts already described thus far are identified by the same reference numerals, and description thereof will be omitted.

The signal evaluating circuit 9 in this case includes: a ROM 81 storing, as correspondence information 81a shown in FIG. 14, the information on the correspondence between the evaluation value Pq and the bit error rate bER which correspondence is determined as described above; and an error rate converting circuit 80 for calculating the bit error rate bER on the basis of the evaluation value Pq supplied from an evaluation value generating circuit 41 and the correspondence information 81a in the ROM 81.

The error rate converting circuit 80 is configured to output the value of the bit error rate bER stored in association with the evaluation value Pq supplied from the evaluation value generating circuit 41 in the correspondence information 81a.

With such a configuration, the bit error rate bER can be calculated from the evaluation value Pq.

For confirmation, the configuration of the fifth embodiment is characterized by the configuration in a stage subsequent to the evaluation value generating circuit 41. It suffices to employ one of the configurations of the above-described first to fourth embodiments for the configuration of parts not shown in FIG. 14.

<Modifications>

While embodiments of the present invention have been described above, the present invention is not to be limited to the foregoing embodiments.

Figure 15:
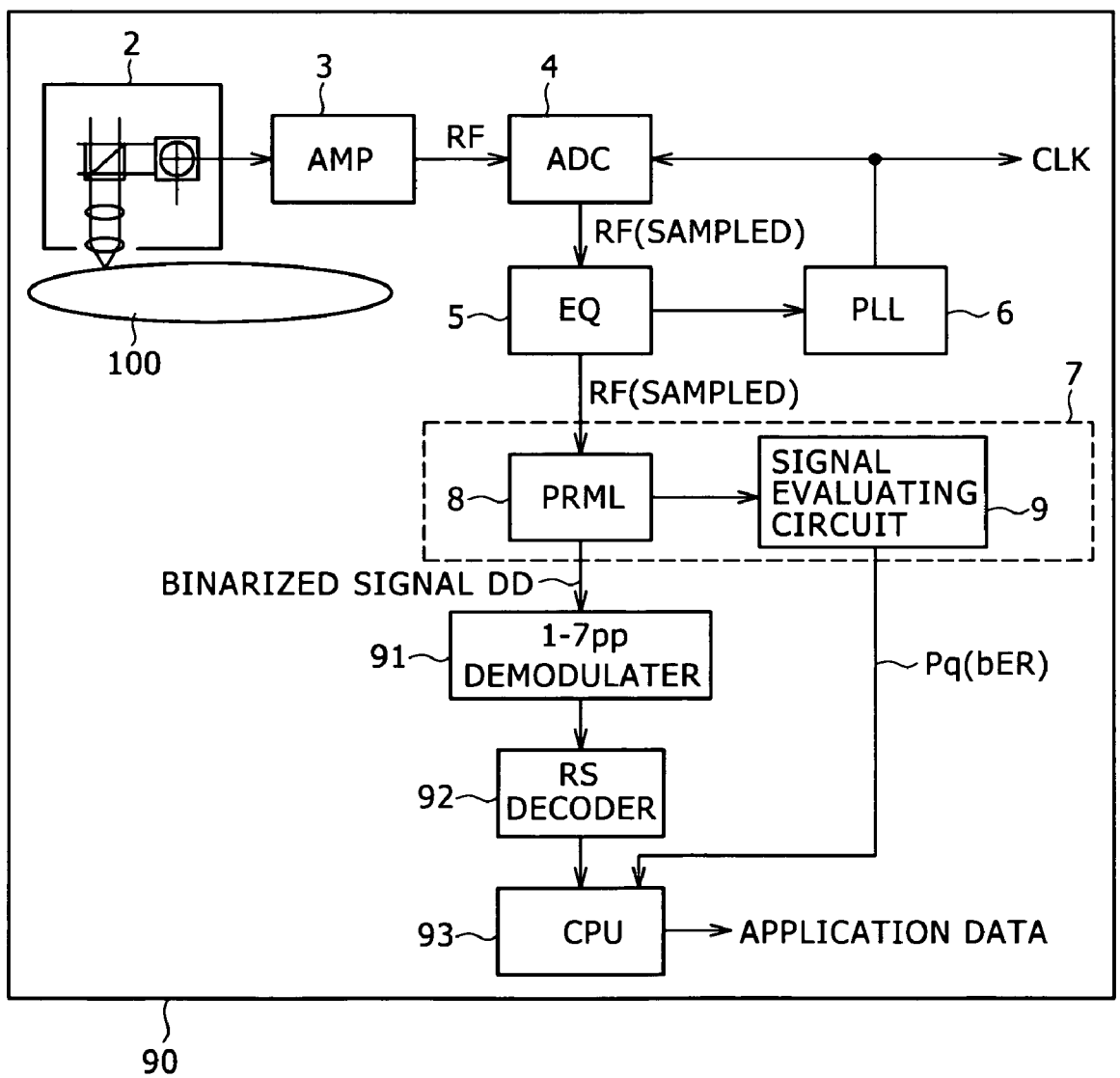
FIG. 15 is a block diagram showing another example of a configuration for evaluating a reproduced signal using an evaluating device according to an embodiment.

For example, while a case is illustrated in which the evaluating device 7 described in each of the embodiments is formed as a device external to the reproduction device 1 for evaluation, the evaluating device 7 can be incorporated in an ordinary reproducing device 90 for an optical disk 100, as shown in FIG. 15.

Incidentally, a configuration for obtaining a reproduced signal RF (sampled) and a clock CLK from the optical disk 100 (an optical pickup 2, a preamplifier 3, an A/D converter 4, an equalizer 5, and a PLL circuit 6) in FIG. 15 is identical to that shown in FIG. 1, and therefore repeated description thereof will be omitted in the following.

As shown in FIG. 15, an evaluating device 7 in this case is disposed in a stage subsequent to the configuration for obtaining the reproduced signal RF (sampled) and the clock CLK in the same reproducing device 90. Though not shown in the figure, also in this case, the clock CLK is supplied as an operating clock for each part within the evaluating device 7.

In this case, the reproducing device 90 further includes for example: a demodulator 91 such as a RLL (1-7) PP demodulator or the like for demodulating bit information on the basis of a binarized signal DD obtained from a PRML decoder 8 in the evaluating device 7; an RS decoder 92 for performing error correction on the demodulated information; and a CPU (Central Processing Unit) block 93 for processing the error-corrected information and thereby generating application data.

The demodulator 91 demodulates the binarized signal DD supplied thereto according to a modulation system at a time of recording. Further, the RS decoder 92 decodes the Reed-Solomon code of an ECC block in the demodulated output of the demodulator 91, and corrects errors. The CPU block 93 confirms that no error is detected in error detecting code in an EDC block, whereby original application data is restored. That is, reproduced data is thereby obtained.

In addition, the CPU block 93 is supplied with an evaluation value Pq (or a bit error rate bER) from the evaluating device 7. The evaluation value Pq (or the bit error rate bER) is used as a signal quality evaluation index at a time of an operation of adjusting various parameters for reproduction (or recording and reproduction) of the optical disk 100, such as focus adjustment for correcting spherical aberration, for example.

Incidentally, since it is supposed that the output of the evaluating device 7 in this case is for example used to adjust the various parameters for reproduction (or recording and reproduction) of the disk as described above, it suffices to simply indicate the magnitude of the value of the output. That is, an absolute index such as the bit error rate bER is not particularly required as the evaluation index in this case. It suffices to simply output the evaluation value Pq.

As compared with the configuration that outputs the bit error rate bER, the configuration that outputs the evaluation value Pq as the evaluating device 7 can do away with the error rate converting circuit 80 and the ROM 81, and is thus correspondingly simplified. In addition, since a converting process as described above is not performed, a time taken to output an evaluation value is shortened, and the adjusting operation is correspondingly sped up.

While in the embodiments, a case is illustrated in which the reproduction device 1 for evaluation and the reproducing device 90 reproduce the optical disk 100, the reproduction device 1 for evaluation and the reproducing device 90 can be formed as a recording and reproducing device that also performs recording on the optical disk 100.

In addition, the reproduction device 1 for evaluation and the reproducing device 90 can be configured to perform at least reproduction of not only the optical disk 100 but also magnetic disks such as hard disks and the like and magneto-optical disks such as MDs (Mini Disks) and the like.

Further, the evaluating device (and the evaluating method) according to each of the embodiments of the present invention can be suitably applied not only to cases where a reproduced signal from a recording medium is evaluated as described above but also to cases where signal quality is evaluated on a receiving device side in a transmission and reception system in which data communication is performed by wire or by radio.

Further, while in the embodiments, a case is illustrated in which the operation of calculating the evaluation value Pq and the bit error rate bER is implemented by hardware, this operation can also be implemented by software processing. In this case, it suffices for an information processing device such as a microcomputer, for example, to perform a processing operation for implementing the operation of the signal evaluating circuit 9 described in each of the embodiments on the basis of an output from the PRML decoder 8.

Alternatively, it is possible to omit the error rate converting circuit 80 and the ROM 81 in the signal evaluating circuit 9 according to the fifth embodiment, in particular, output the evaluation value Pq to the outside, and calculate the bit error rate bER on the basis of the evaluation value Pq and the correspondence information 81a in an external information processing device.

Further, in each of the embodiments, the Euclidean distance $d_k^2$ for each error pattern k is actually calculated from the maximum likelihood path Pa and the second path Pb. However, the Euclidean distance dk for each error pattern k is known as a matter of course when the error pattern is identified. The Euclidean distance calculating circuit 35 provided in each of the embodiments can therefore be configured to read the Euclidean distance $d_k^2$ corresponding to the error pattern k identified from the maximum likelihood path Pa and the second path Pb on the basis of information associating the Euclidean distance $d_k^2$ with each error pattern k.

Further, while in the embodiments, the threshold value Th_k is set at ½ of the Euclidean distance $d_k^2$ the threshold value Th_k may be set at ⅓ of the Euclidean distance $d_k^2$, for example, and is not limited to ½ of the Euclidean distance $d_k^2$.

Incidentally, depending on a fraction of the Euclidean distance $d_k^2$ at which fraction the threshold value Th_k is set, the relation between the value of the calculated evaluation value Pq and the value of the bit error rate bER correspondingly differs.

For example, referring to FIG. 4, a comparison between a case of the threshold value Th_k being set at ⅓ of the Euclidean distance $d_k^2$ and a case of the threshold value Th_k being set at ½ of the Euclidean distance $d_k^2$ for a disk having a certain bit error rate bER indicates that the frequency of occurrence of values of metric difference MD which values are less than the threshold value Th_k (the value of the evaluation value Pq) is reduced for the same bit error rate bER in the case of the threshold value Th_k being set at ⅓ of the Euclidean distance $d_k^2$.

The value of the evaluation value Pq being thus smaller for the same error rate means that a curve rising more steeply is obtained in the case of the threshold value Th_k being set at ⅓ of the Euclidean distance $d_k^2$ as compared with the curve shown in FIG. 13 in the case of the threshold value Th_k being set at ½ of the Euclidean distance $d_k^2$. When the curve representing the relation between the evaluation value Pq and the bit error rate bER thus becomes steeper, the value of the bit error rate bER varies more with a change in the value of the evaluation value Pq, and therefore a margin of detection error is reduced.

Hence, it suffices to determine the value of a fraction of the Euclidean distance $d_k^2$ at which fraction to set the threshold value Th_k, that is, to set a value by which to divide the Euclidean distance $d_k^2$ according to such a margin of detection error to be secured, for example.

Incidentally, it is true in either case that when the threshold value Th_k obtained by dividing the Euclidean distance $d_k^2$ by a common value is set, a signal quality evaluation index reflecting the rate of contribution of each error pattern to the total error rate and correlating well with the total error rate can be obtained.

It should be understood by those skilled in the art that various modifications, combinations, sub-combinations and alterations may occur depending on design requirements and other factors insofar as they are within the scope of the appended claims or the equivalents thereof.

What is claimed is:

1. An evaluating device comprising:
   Viterbi detecting means for performing bit detection by performing Viterbi detection from a reproduced signal in which bit information is reproduced;
   metric difference calculating means for calculating a metric difference as a difference between a value of a path metric for a second path and a value of a path metric for a maximum likelihood path when at least an error pattern between said maximum likelihood path as a path surviving as a result of path selection by said Viterbi detecting means and said second path compared finally with said maximum likelihood path corresponds to one of a predetermined plurality of error patterns;
   evaluation value calculating means for comparing each of values of metric differences for each said error pattern, said metric differences being calculated by said metric difference calculating means, with an individual threshold value obtained by dividing a Euclidean distance between said maximum likelihood path and said second path in each said error pattern by a common value, and calculating a total number of values of said metric differences less than said threshold value as an evaluation value; and first error pattern determining means for determining whether or not the error pattern between said maximum likelihood path and said second path corresponds to one of said predetermined plurality of error patterns on the basis of information of a bit sequence of said maximum likelihood path and information of a bit sequence of said second path obtained by said Viterbi detecting means, wherein said metric difference calculating means calculates a value of said metric difference for said maximum likelihood path and said second path corresponding to one of said predetermined plurality of error patterns on the basis of a result of determination of said first error pattern determining means, and said evaluation value calculating means calculates the Euclidean distance between said maximum likelihood path and said second path in each said error pattern on the basis of the result of determination of said first error pattern determining means.

2. The evaluating device as claimed in claim 1, wherein said Viterbi detecting means variably sets reference levels used for branch metric calculation according to levels of said reproduced signal.

3. The evaluating device as claimed in claim 1, further comprising:

storing means for storing correspondence information indicating a correspondence between said evaluation value and a value of a bit error rate corresponding to said evaluation value; and converting means for converting said evaluation value into said bit error rate on the basis of said evaluation value calculated by said evaluation value calculating means and said correspondence information stored by said storing means.

4. A reproducing apparatus for performing at least reproduction on a recording medium, comprising at least:

reproduced signal generating means for obtaining a reproduced signal by reading bit information recorded on said recording medium;

an evaluating unit for performing bit detection by performing Viterbi detection from said reproduced signal obtained by said reproduced signal generating means, and obtaining an evaluation value indicating quality of said reproduced signal on the basis of at least a result of the bit detection and the reproduced signal obtained by said reproduced signal generating means; and demodulating means for obtaining reproduced data by receiving and demodulating bit information obtained as the result of said bit detection in said evaluating unit;

wherein said evaluating unit includes:

Viterbi detecting means for performing the bit detection by performing the Viterbi detection from the reproduced signal in which the bit information is reproduced, metric difference calculating means for calculating a metric difference as a difference between a value of a path metric for a second path and a value of a path metric for a maximum likelihood path when at least an error pattern between said maximum likelihood path as a path surviving as a result of path selection by said Viterbi detecting means and said second path compared finally with said maximum likelihood path corresponds to one of a predetermined plurality of error patterns, evaluation value calculating means for comparing each of values of metric differences for each said error pattern, said metric differences being calculated by said metric difference calculating means, with an individual threshold value obtained by dividing a Euclidean distance between said maximum likelihood path and said second path in each said error pattern by a common value, and calculating a total number of values of said metric differences less than said threshold value as the evaluation value, and first error pattern determining means for determining whether or not the error pattern between said maximum likelihood path and said second path corresponds to one of said predetermined plurality of error patterns on the basis of information of a bit sequence of said maximum likelihood path and information of a bit sequence of said second path obtained by said Viterbi detecting means, wherein said metric difference calculating means calculates a value of said metric difference for said maximum likelihood path and said second path corresponding to one of said predetermined plurality of error patterns on the basis of a result of determination of said first error pattern determining means, and said evaluation value calculating means calculates the Euclidean distance between said maximum likelihood path and said second path in each said error pattern on the basis of the result of determination of said first error pattern determining means.

5. An evaluating method for evaluating signal quality of a reproduced signal in which bit information is reproduced, said evaluating method comprising the steps of:

performing bit detection by performing Viterbi detection from said reproduced signal;

calculating a metric difference as a difference between a value of a path metric for a second path and a value of a path metric for a maximum likelihood path when at least an error pattern between said maximum likelihood path as a path surviving as a result of path selection in said Viterbi detecting step and said second path compared finally with said maximum likelihood path corresponds to one of a predetermined plurality of error patterns;

comparing each of values of metric differences for each said error pattern, said metric differences being calculated in said metric difference calculating step, with an individual threshold value obtained by dividing a Euclidean distance between said maximum likelihood path and said second path in each said error pattern by a common value, and calculating a total number of values of said metric differences less than said threshold value as an evaluation; and determining whether or not the error pattern between said maximum likelihood path and said second path corresponds to one of said predetermined plurality of error patterns on the basis of information of a bit sequence of said maximum likelihood path and information of a bit sequence of said second path, wherein a value of said metric difference is calculated for said maximum likelihood path and said second path corresponding to one of said predetermined plurality of error patterns on the basis of a result of the determining, and said Euclidean distance is calculated between said maximum likelihood path and said second path in each said error pattern on the basis of the result.

6. An evaluating device comprising:

a Viterbi detector configured to perform bit detection by performing Viterbi detection from a reproduced signal in which bit information is reproduced;

a metric difference calculator configured to calculate a metric difference as a difference between a value of a path metric for a second path and a value of a path metric for a maximum likelihood path when at least an error pattern between said maximum likelihood path as a path surviving as a result of path selection by said Viterbi detector and said second path compared finally with said maximum likelihood path corresponds to one of a predetermined plurality of error patterns;

an evaluation value calculator configured to compare each of values of metric differences for each said error pattern, said metric differences being calculated by said metric difference calculator, with an individual threshold value obtained by dividing a Euclidean distance between said maximum likelihood path and said second path in each said error pattern by a common value, and calculate a total number of values of said metric differences less than said threshold value as an evaluation value; and an enabler configured to determine whether or not the error pattern between said maximum likelihood path and said second path corresponds to one of said predetermined plurality of error patterns on the basis of information of a bit sequence of said maximum likelihood path and information of a bit sequence of said second path obtained by said Viterbi detector, wherein said metric difference calculator calculates a value of said metric difference for said maximum likelihood path and said second path corresponding to one of said predetermined plurality of error patterns on the basis of a result of determination of said enabler, and said evaluation value calculator calculates the Euclidean distance between said maximum likelihood path and said second path in each said error pattern on the basis of the result of determination of said enabler.

7. An evaluating device comprising:

Viterbi detecting means for performing bit detection by performing Viterbi detection from a reproduced signal in which bit information is reproduced;

metric difference calculating means for calculating a metric difference as a difference between a value of a path metric for a second path and a value of a path metric for a maximum likelihood path when at least an error pattern between said maximum likelihood path as a path surviving as a result of path selection by said Viterbi detecting means and said second path compared finally with said maximum likelihood path corresponds to one of a predetermined plurality of error patterns;

evaluation value calculating means for comparing each of values of metric differences for each said error pattern, said metric differences being calculated by said metric difference calculating means, with an individual threshold value obtained by dividing a Euclidean distance between said maximum likelihood path and said second path in each said error pattern by a common value, and calculating a total number of values of said metric differences less than said threshold value as an evaluation value; and second error pattern determining means for determining whether or not said maximum likelihood path and said second path correspond to one of said predetermined plurality of error patterns on the basis of a pattern table in which patterns of bit sequences of said maximum likelihood path and said second path assumed as said predetermined plurality of error patterns are stored in association with each other, wherein said metric difference calculating means calculates a value of said metric difference for said maximum likelihood path and said second path corresponding to one of said predetermined plurality of error patterns on the basis of a result of determination of said second error pattern determining means, and said evaluation value calculating means calculates the Euclidean distance between said maximum likelihood path and said second path in each said error pattern on the basis of the result of determination of said second error pattern determining means.

8. A reproducing apparatus for performing at least reproduction on a recording medium, comprising:

reproduced signal generating means for obtaining a reproduced signal by reading bit information recorded on said recording medium;

an evaluating unit for performing bit detection by performing Viterbi detection from said reproduced signal obtained by said reproduced signal generating means, and obtaining an evaluation value indicating quality of said reproduced signal on the basis of at least a result of the bit detection and the reproduced signal obtained by said reproduced signal generating means; and demodulating means for obtaining reproduced data by receiving and demodulating bit information obtained as the result of said bit detection in said evaluating unit;

wherein said evaluating unit includes:

Viterbi detecting means for performing the bit detection by performing the Viterbi detection from the reproduced signal in which the bit information is reproduced, metric difference calculating means for calculating a metric difference as a difference between a value of a path metric for a second path and a value of a path metric for a maximum likelihood path when at least an error pattern between said maximum likelihood path as a path surviving as a result of path selection by said Viterbi detecting means and said second path compared finally with said maximum likelihood path corresponds to one of a predetermined plurality of error patterns, evaluation value calculating means for comparing each of values of metric differences for each said error pattern, said metric differences being calculated by said metric difference calculating means, with an individual threshold value obtained by dividing a Euclidean distance between said maximum likelihood path and said second path in each said error pattern by a common value, and calculating a total number of values of said metric differences less than said threshold value as the evaluation value, second error pattern determining means for determining whether or not said maximum likelihood path and said second path correspond to one of said predetermined plurality of error patterns on the basis of a pattern table in which patterns of bit sequences of said maximum likelihood path and said second path assumed as said predetermined plurality of error patterns are stored in association with each other, wherein said metric difference calculating means calculates a value of said metric difference for said maximum likelihood path and said second path corresponding to one of said predetermined plurality of error patterns on the basis of a result of determination of said second error pattern determining means, and said evaluation value calculating means calculates the Euclidean distance between said maximum likelihood path and said second path in each said error pattern on the basis of the result of determination of said second error pattern determining means.

9. An evaluating method for evaluating signal quality of a reproduced signal in which bit information is reproduced, said evaluating method comprising the steps of:

performing bit detection by performing Viterbi detection from said reproduced signal;

calculating a metric difference as a difference between a value of a path metric for a second path and a value of a path metric for a maximum likelihood path when at least an error pattern between said maximum likelihood path as a path surviving as a result of path selection in said Viterbi detecting step and said second path compared finally with said maximum likelihood path corresponds to one of a predetermined plurality of error patterns;

comparing each of values of metric differences for each said error pattern, said metric differences being calculated in said metric difference calculating step, with an individual threshold value obtained by dividing a Euclidean distance between said maximum likelihood path and said second path in each said error pattern by a common value, and calculating a total number of values of said metric differences less than said threshold value as an evaluation value; and determining whether or not said maximum likelihood path and said second path correspond to one of said predetermined plurality of error patterns on the basis of a pattern table in which patterns of bit sequences of said maximum likelihood path and said second path assumed as said predetermined plurality of error patterns are stored in association with each other, wherein a value of said metric difference is calculated for said maximum likelihood path and said second path corresponding to one of said predetermined plurality of error patterns on the basis of a result of the determining, and said evaluation value calculating means calculates the Euclidean distance between said maximum likelihood path and said second path in each said error pattern on the basis of the result.

10. An evaluating device comprising:

a Viterbi detector configured to perform bit detection by performing Viterbi detection from a reproduced signal in which bit information is reproduced;

a metric difference calculator configured to calculate a metric difference as a difference between a value of a path metric for a second path and a value of a path metric for a maximum likelihood path when at least an error pattern between said maximum likelihood path as a path surviving as a result of path selection by said Viterbi detector and said second path compared finally with said maximum likelihood path corresponds to one of a predetermined plurality of error patterns;

an evaluation value calculator configured to compare each of values of metric differences for each said error pattern, said metric differences being calculated by said metric difference calculator, with an individual threshold value obtained by dividing a Euclidean distance between said maximum likelihood path and said second path in each said error pattern by a common value, and calculate a total number of values of said metric differences less than said threshold value as an evaluation value; and a pattern detector configured to determine whether or not said maximum likelihood path and said second path correspond to one of said predetermined plurality of error patterns on the basis of a pattern table in which patterns of bit sequences of said maximum likelihood path and said second path assumed as said predetermined plurality of error patterns are stored in association with each other, wherein said metric difference calculator calculates a value of said metric difference for said maximum likelihood path and said second path corresponding to one of said predetermined plurality of error patterns on the basis of a result of determination of said pattern detector, and said evaluation value calculator the Euclidean distance between said maximum likelihood path and said second path in each said error pattern on the basis of the result of determination of said pattern detector.

* * * * *